(12) United States Patent
Kim et al.

(10) Patent No.: US 12,396,281 B2
(45) Date of Patent: Aug. 19, 2025

(54) IMAGE SENSOR WITH REDUCED CROSSTALK BETWEEN PIXELS

(71) Applicant: SAMSUNG ELECTRONICS CO., LTD., Suwon-si (KR)

(72) Inventors: Bokwon Kim, Suwon-si (KR); Changkyu Lee, Hwaseong-si (KR); Kwangmin Lee, Seoul (KR); Minhwan Jeon, Hwaseong-si (KR); Jonguk Kim, Hwaseong-si (KR); Minsung Heo, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 809 days.

(21) Appl. No.: 17/534,706

(22) Filed: Nov. 24, 2021

(65) Prior Publication Data

US 2022/0165763 A1 May 26, 2022

(30) Foreign Application Priority Data

Nov. 24, 2020 (KR) .......... 10-2020-0159220
Jul. 26, 2021 (KR) .......... 10-2021-0098110

(51) Int. Cl.
*H10F 39/12* (2025.01)
*H10F 39/00* (2025.01)

(52) U.S. Cl.
CPC .......... *H10F 39/807* (2025.01); *H10F 39/199* (2025.01); *H10F 39/8053* (2025.01); *H10F 39/8057* (2025.01)

(58) Field of Classification Search
CPC .......... H01L 27/14621; H01L 27/14623; H01L 27/1463; H01L 27/1464; H10F 39/199; H10F 39/807; H10F 39/8053; H10F 39/8057
See application file for complete search history.

(56) References Cited

U.S. PATENT DOCUMENTS

| | | |
|---|---|---|
| 8,378,440 B2 | 2/2013 | Kwon et al. |
| 9,224,770 B2 | 12/2015 | Lin et al. |
| 9,455,288 B2 | 9/2016 | Tsai et al. |
| 10,014,338 B2 | 7/2018 | Lee |
| 10,741,596 B2 | 8/2020 | Kim et al. |
| 2012/0261782 A1 | 10/2012 | Kobayashi et al. |
| 2019/0157329 A1* | 5/2019 | Kim .......... H01L 27/1464 |
| 2019/0229140 A1 | 7/2019 | Naito et al. |
| 2019/0267420 A1 | 8/2019 | Lee |
| 2019/0386049 A1* | 12/2019 | Jung .......... H04N 25/745 |
| 2020/0083268 A1 | 3/2020 | Kim et al. |

(Continued)

FOREIGN PATENT DOCUMENTS

| | | |
|---|---|---|
| JP | H10-154805 A | 6/1998 |
| JP | 2012-186364 A | 9/2012 |

(Continued)

*Primary Examiner* — Nelson Garces
(74) *Attorney, Agent, or Firm* — Wolf, Greenfield & Sacks, P.C.

(57) ABSTRACT

An image sensor includes a first pixel; a second pixel disposed adjacent to the first pixel; a pixel isolation structure disposed between the first pixel and the second pixel; a rear side anti-reflective layer disposed on the first pixel, the second pixel, and the pixel isolation structure; and a fence disposed on the rear side anti-reflective layer aligning with the pixel isolation structure and including a buried air gap.

17 Claims, 29 Drawing Sheets

(56) References Cited

U.S. PATENT DOCUMENTS

| | | |
|---|---|---|
| 2020/0219920 A1 | 7/2020 | Hur et al. |
| 2020/0395392 A1 | 12/2020 | Do |
| 2021/0183928 A1 | 6/2021 | Hoshi et al. |
| 2021/0366969 A1* | 11/2021 | Bak .................. H01L 27/14645 |

FOREIGN PATENT DOCUMENTS

| | | |
|---|---|---|
| JP | 5430387 B2 | 2/2014 |
| JP | 2014-138071 A | 7/2014 |
| JP | 2019-87659 A | 6/2019 |
| KR | 10-2011-0079326 A | 7/2011 |
| KR | 10-2014-0029933 A | 3/2014 |
| KR | 10-2018-0040308 A | 4/2018 |
| KR | 10-2019-0057601 A | 5/2019 |
| KR | 10-2019-0142874 A | 12/2019 |
| KR | 10-2020-0082333 A | 7/2020 |

* cited by examiner

IMAGE SENSOR WITH REDUCED CROSSTALK BETWEEN PIXELS

CROSS-REFERENCE TO RELATED APPLICATIONS

This application is based on and claims priority under 35 U.S.C. § 119 to Korean Patent Application Nos. 10-2020-0159220, filed on Nov. 24, 2020, and 10-2021-0098110, filed on Jul. 26, 2021, in the Korean Intellectual Property Office, the disclosures of which are incorporated by reference herein in their entirety.

BACKGROUND

The inventive concept relates to an image sensor, and more particularly, to a complementary metal oxide semiconductor (CMOS) image sensor.

An image sensor that captures an image and converts the image into an electric signal, e.g., a CMOS image sensor, may not only be used in general consumer electronic devices like a digital camera, a mobile phone camera, and a portable camcorder, but also in cameras used for automobiles, security devices, and robots.

As image sensors become smaller, the size of a pixel also has to decrease. In an image sensor, as the size of a pixel decreases, crosstalk between pixels increases, and the image sensor may become defective.

SUMMARY

The inventive concept provides an image sensor capable of reducing crosstalk between pixels and reducing defects in an image sensor.

In accordance with an inventive concept of the disclosure, there is provided an image sensor including: a first pixel; a second pixel disposed adjacent to the first pixel; a pixel isolation structure disposed between the first pixel and the second pixel; a rear side anti-reflective layer disposed on the first pixel, the second pixel, and the pixel isolation structure; and a fence disposed on the rear side anti-reflective layer aligning with the pixel isolation structure and including a buried air gap.

In accordance with an inventive concept of the disclosure, there is provided an image sensor including: a first pixel; a second pixel disposed adjacent to the first pixel; a pixel isolation structure disposed between the first pixel and the second pixel; a rear side anti-reflective layer disposed on the first pixel, the second pixel, and the pixel isolation structure and including a plurality of sub rear side anti-reflective layers; and a fence disposed on the rear side anti-reflective layer aligning with the pixel isolation structure, and including a buried air gap and a penetration layer penetrating through at least one of the plurality of sub rear side anti-reflective layers.

In accordance with an inventive concept of the disclosure, there is provided an image sensor including: a substrate having a first surface and a second surface opposite to the first surface, wherein the first surface indicates a front surface of the substrate and the second surface indicates a rear surface of the substrate; a first pixel disposed in the substrate; a second pixel disposed in the substrate and adjacent to the first pixel; a pixel isolation structure positioned between the second surface and the first surface of the substrate and separating the first pixel and the second pixel from each other; a rear side anti-reflective layer disposed on the first pixel, the second pixel, and the pixel isolation structure on the second surface of the substrate, and including a plurality of sub rear side anti-reflective layers; a fence disposed on the rear side anti-reflective layer aligning with the pixel isolation structure, and including a buried air gap and a penetration layer penetrating through at least one of the plurality of sub rear side anti-reflective layers; and a plurality of color filters disposed on the rear side anti-reflective layer and separated by the fence.

BRIEF DESCRIPTION OF THE DRAWINGS

Embodiments of the inventive concept will be more clearly understood from the following detailed description taken in conjunction with the accompanying drawings in which.

DETAILED DESCRIPTION

Figure 1:
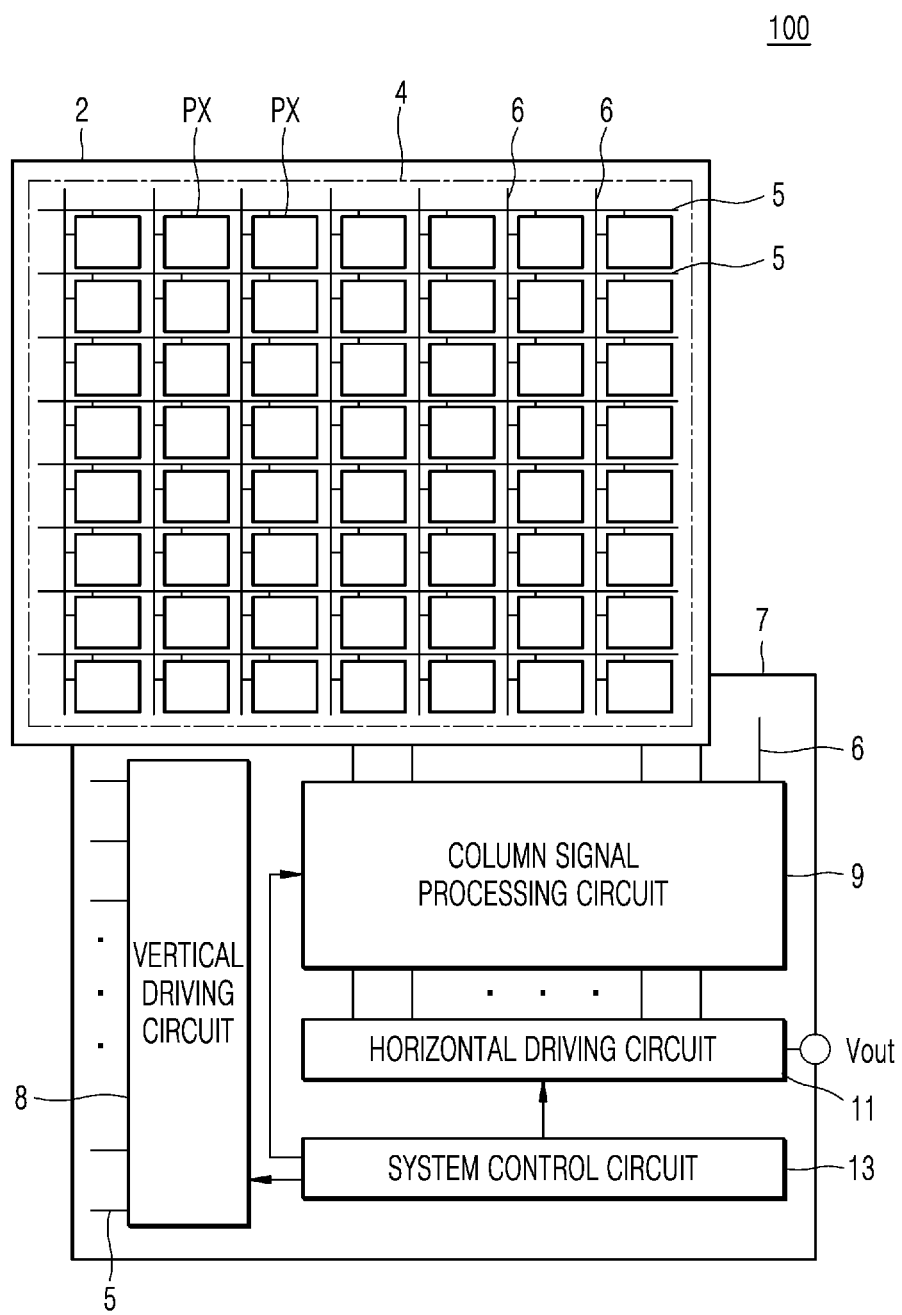
FIG. 1 is a schematic circuit diagram of an image sensor according to an embodiment.

FIG. 1 is a schematic circuit diagram of an image sensor according to an embodiment.

Referring to FIG. 1, an image sensor 100 may be a stacked image sensor including a first substrate 2 and a second substrate 7. The image sensor 100 may be a complementary metal oxide semiconductor (CMOS)-type image sensor. The inventive concept described below may be mainly applied to the first substrate 2. However, the inventive concept is not limited thereto, and may be applied to any other parts or components of the image sensor 100.

The image sensor 100 may include the first substrate 2 and the second substrate 7. The image sensor 100 may be configured by stacking and adhering the first substrate 2 onto the second substrate 7. The first substrate 2 may be a sensor substrate including one or more pixel circuits. The second substrate 7 may include a logic circuit for driving the one or more pixel circuits and may be a supporting substrate that supports the first substrate 2. The first substrate 2 and the second substrate 7 may be electrically connected to each other.

The first substrate 2 may include a pixel array region 4 in which unit pixels PX, each unit pixel including a photoelectric conversion region regularly and 2-dimensionally arranged is provided. In the pixel array region 4, pixel driving lines 5 are arranged in a row-wise direction (e.g., horizontal direction), and vertical signal lines 6 are arranged in a column-wise direction (e.g., vertical direction).

One unit pixel PX is provided to be connected to one pixel driving line 5 and one vertical signal line 6. Each unit pixel PX may be provided with a pixel circuit including a photoelectric converter, a charge accumulator, transistors (e.g., a metal oxide semiconductor (MOS) transistor), and/or a capacitive element.

The second substrate 7 may include logic circuits for driving the unit pixels PX provided in the first substrate 2. The logic circuits may include a vertical driving circuit 8, a column signal processing circuit 9, a horizontal driving circuit 11, and a system control circuit 13. The image sensor 100 may output a voltage (output voltage) Vout through the horizontal driving circuit 11.

Figure 2:
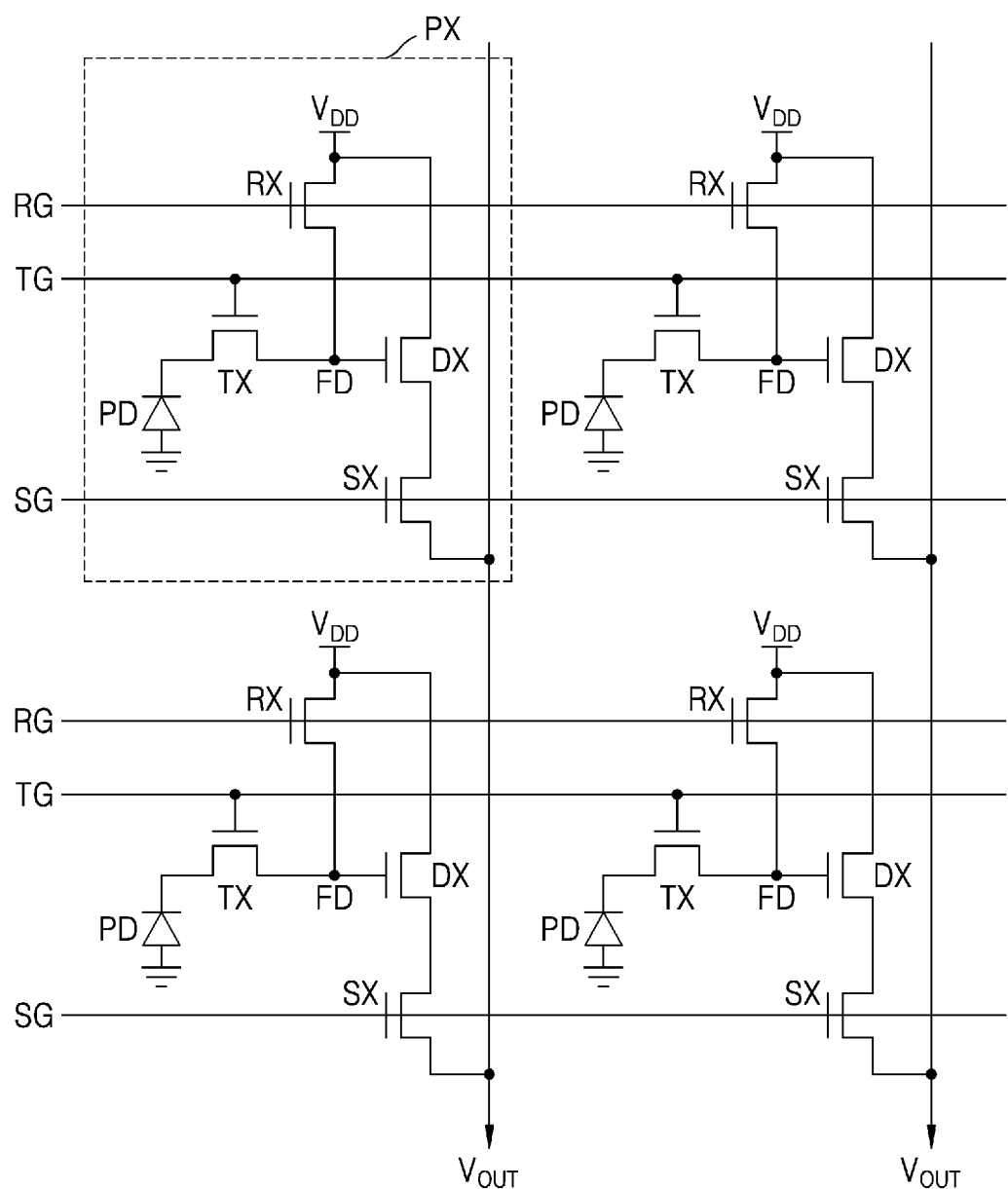
FIG. 2 is a circuit diagram of pixels included in an image sensor according to an embodiment.

FIG. 2 is a circuit diagram of pixels included in an image sensor according to an embodiment.

Referring to FIG. 2, a plurality of pixels PX may be arranged in a matrix form or an array form. The plurality of pixels PX may each include a transmission transistor TX and logic transistors.

The logic transistors may include a reset transistor RX, a select transistor SX, and a drive transistor DX (or a source follower transistor). The reset transistor RX may include a reset gate RG, the select transistor SX may include a select gate SG, and the transmission transistor TX may include a transmission gate TG.

The plurality of pixels PX may each include a photoelectric conversion element PD and a floating diffusion region FD. The photoelectric conversion element PD may correspond to a photoelectric conversion region described below. The photoelectric conversion element PD may generate and accumulate photo charges in proportion to an amount of external incident light and may include a photodiode, a phototransistor, a photo gate, a pinned photodiode (PPD), and combinations thereof.

The transmission transistor TX may operate according to a transmission control signal transmitted to the transmission gate TG of the transmission transistor TX. The transmission transistor TX may transfer charges generated by the photoelectric conversion element PD to the floating diffusion region FD. The floating diffusion region FD may receive and cumulatively store electric charges generated by the photoelectric conversion element PD. Charges generated by the photoelectric conversion element PD may be transferred to the floating diffusion region FD by the transmission transistor TX and accumulated therein. The drive transistor DX may be controlled according to an amount of photo charges accumulated in the floating diffusion region FD.

The reset transistor RX may periodically reset charges accumulated in the floating diffusion region FD. The reset transistor RX may operate according to a reset control signal transmitted through the reset gate RG. A drain electrode of the reset transistor RX is connected to the floating diffusion region FD, and a source electrode of the reset transistor RX is connected to a power voltage VDD.

When the reset transistor RX is turned on by the reset control signal, the power voltage VDD connected to the source electrode of the reset transistor RX is transferred to the floating diffusion region FD. When the reset transistor RX is turned on, charges accumulated in the floating diffusion region FD are discharged, and thus, the floating diffusion region FD may be reset. The reset transistor RX may reset the voltage of the floating diffusion region FD to the power voltage VDD.

The drive transistor DX is connected to a current source (not shown) located outside the pixels PX and functions as a source follower buffer amplifier. The drive transistor DX may amplify charges accumulated in the floating diffusion region FD and transfer the amplified charges to the select transistor SX. The drive transistor DX amplifies a change in potential in the floating diffusion region FD and outputs a result thereof as an output voltage Vout.

The select transistor SX may select the pixels PX row-by-row. The select transistor SX may select a unit pixel according to a selection control signal transmitted to the select gate SG. When the select transistor SX is turned on, the power voltage VDD may be transferred to a source electrode of the select transistor SX. The select transistor SX may operate according to the selection control signal and may perform a switching operation and an addressing operation. When the selection control signal is applied to the select transistor SX, the select transistor SX may output the output voltage Vout in the unit pixel. When the selection control signal is not applied to the select transistor SX, the select transistor SX may not output voltage Vout of the unit pixel.

Figure 3:
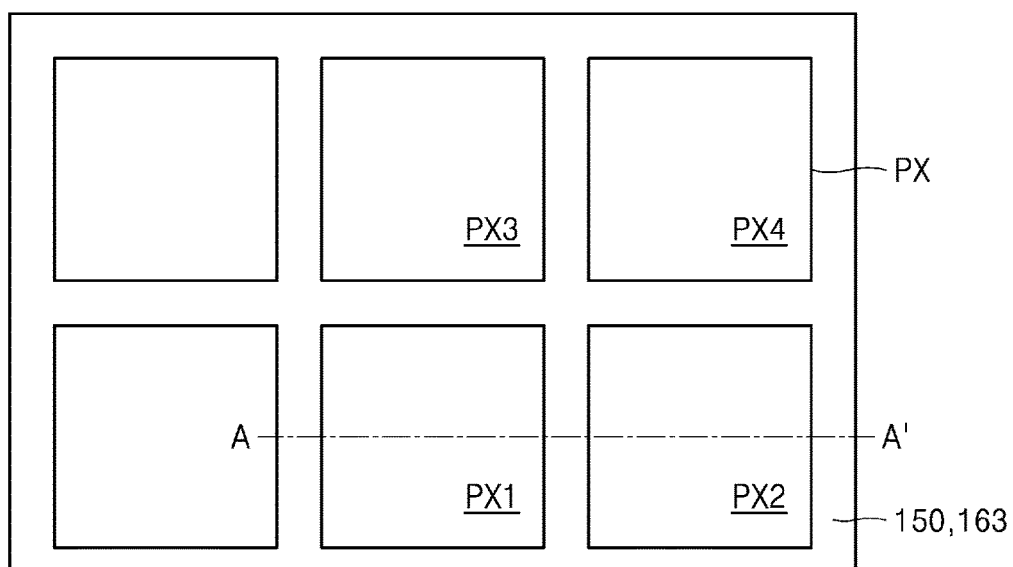
FIG. 3 is a plan view of an image sensor according to an embodiment.

FIG. 3 is a plan view of an image sensor according to an embodiment.

Referring to FIG. 3, the image sensor 100 may include a plurality of pixels PX. The plurality of pixels PX may be arranged 2-dimensionally. For example, a second pixel PX2 may be disposed adjacent to and apart from a first pixel PX1 in a first direction (X direction), and a third pixel PX3 may be disposed adjacent to and apart from the first pixel PX1 in a second direction (Y direction).

A fourth pixel PX4 may be disposed apart from the first pixel PX1 in a diagonal direction (D direction), disposed adjacent to and apart from the second pixel PX2 in the second direction (Y direction), and disposed adjacent to and apart from the third pixel PX3 in the first direction (X direction).

In some embodiments, the first direction (X direction) may be perpendicular to the second direction (Y direction). In some embodiments, the diagonal direction (D direction) may be oblique with respect to the first direction (X direction) and the second direction (Y direction). In some embodiments, the diagonal direction (D direction) may be 45 degrees inclined with respect to the first direction (X direction) and the second direction (Y direction). However, in another embodiment, the diagonal direction (D direction) may be inclined with respect to the first direction (X direction) and the second direction (Y direction) by different angles.

A pixel isolation structure 150 may be provided between the pixels PX. The pixel isolation structure 150 may physically and electrically isolate one pixel PX from an adjacent pixel PX (e.g., a first pixel PX1 from a second pixel PX2). The pixel isolation structure 150 may be arranged in a mesh-like shape or a grid-like shape when viewed from above (viewed in a Z-direction). In some embodiments, the pixel isolation structure 150 may extend between the pixels PX. For example, the pixel isolation structure 150 may extend between the first pixel PX1 and the second pixel PX2, between the first pixel PX1 and the third pixel PX3, between the second pixel PX2 and the fourth pixel PX4, and between the third pixel PX3 and the fourth pixel PX4.

A fence 163 may be disposed on the pixel isolation structure 150. The fence 163 may overlap the pixel isolation structure 150 when viewed from above. That is, the fence 163 may extend in the Z-direction. The fence 163 may also extend in the X and Y directions between the pixels PX when viewed from above. For example, when viewed from above, the fence 163 may extend between the first pixel PX1 and the second pixel PX2, between the first pixel PX1 and the third pixel PX3, between the second pixel PX2 and the fourth pixel PX4, and between the third pixel PX3 and the fourth pixel PX4.

Figure 4:
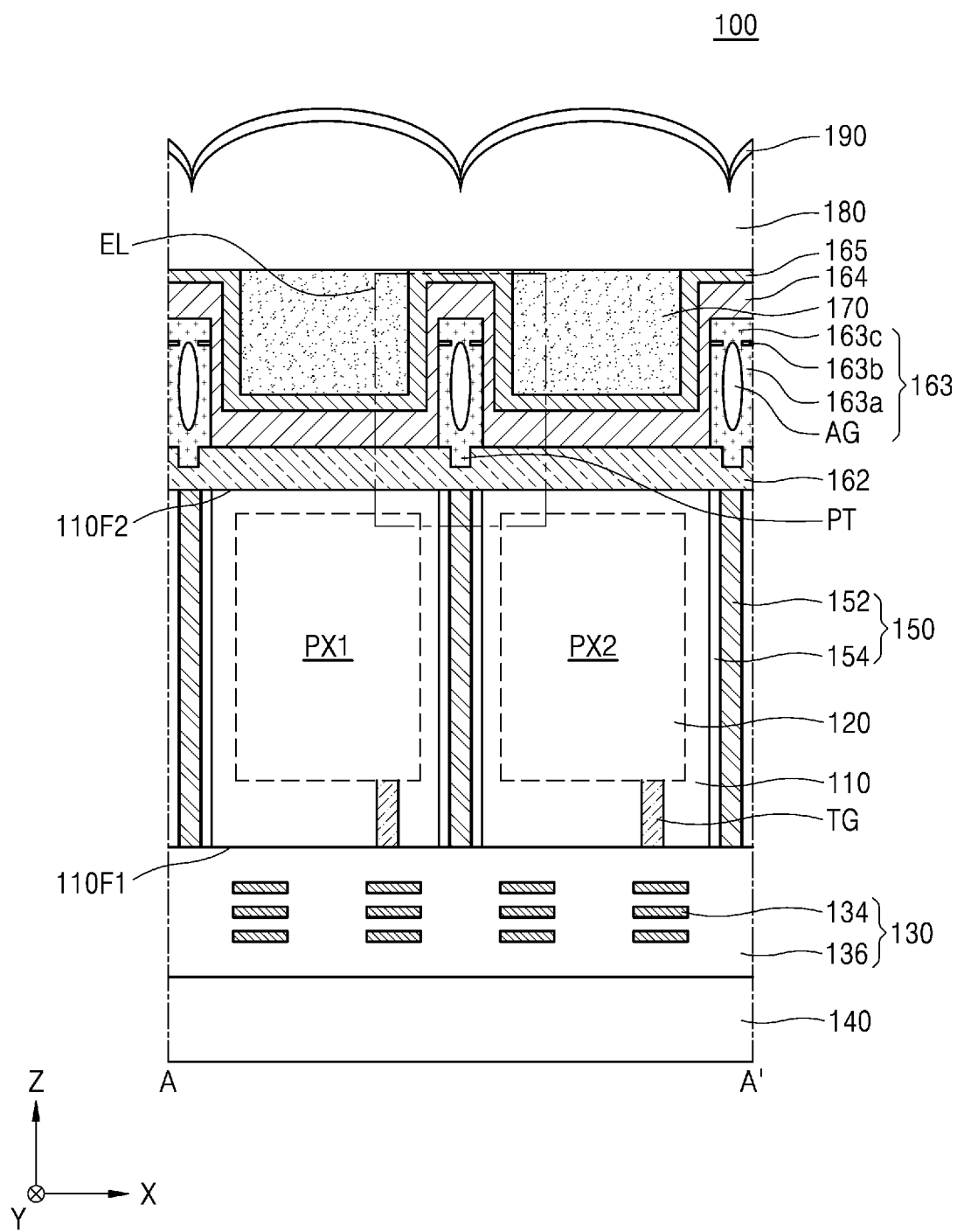
FIG. 4 is a cross-sectional view of an image sensor, taken along a line A-A' of FIG. 3.

FIG. 4 is a cross-sectional view of an image sensor, taken along a line A-A' of FIG. 3.

Referring to FIG. 4, the image sensor 100 may include a substrate 110, a photoelectric conversion region 120, the transmission gate TG, the pixel isolation structure 150, a front side structure 130, a supporting substrate 140, and a rear side anti-reflective layer 162, the fence 163 having a buried air gap AG, an additional rear side anti-reflective layer 164, a passivation layer 165, a color filter 170, a micro lens 180, and a capping layer 190.

The substrate 110 may include a first surface 110F1 and a second surface 110F2. The first surface 110F1 may be the front surface of the substrate 110. The second surface 110F2 may be the rear surface of the substrate 110. In some embodiments, the substrate 110 may include a semiconductor material like a Group IV semiconductor material, a Group III-V semiconductor material, or a Group II-VI semiconductor material.

The Group IV semiconductor material may include silicon (Si), germanium (Ge), or silicon (Si)-germanium (Ge). The Group III-V semiconductor material may include gallium arsenide (GaAs), indium phosphorus (InP), gallium phosphorus (GaP), indium arsenide (InAs), indium antimony (InSb), or indium gallium arsenide (InGaAs). The Group II-VI semiconductor material may include zinc telluride (ZnTe) or cadmium sulfide (CdS).

The substrate 110 may include a P-type semiconductor substrate. In some embodiments, the substrate 110 may include a P-type silicon substrate. In some embodiments, the substrate 110 may include a P-type bulk substrate and a P-type or N-type epitaxial layer grown thereon. In some embodiments, the substrate 110 may include an N-type bulk substrate and a P-type or N-type epitaxial layer grown thereon.

The photoelectric conversion region 120 may be provided in the substrate 110. The photoelectric conversion region 120 may convert an optical signal into an electric signal. The photoelectric conversion region 120 may include a photodiode region (not shown) and a well region (not shown) formed in the substrate 110. The photoelectric conversion region 120 may include impurity regions doped with impurities of a conductivity type opposite to that of the substrate 110.

The transmission gate TG may be provided in the substrate 110. The transmission gate TG may extend into the substrate 110 from the first surface 110F1 of the substrate 110. The transmission gate TG may be a part of a transmission transistor (TX of FIG. 2). The transmission transistor TX, the reset transistor RX, the drive transistor DX, and the select transistor SX described with reference to FIG. 2 may be formed on the first surface 110F1 of the substrate 110.

Although not shown in FIG. 4, a device isolation layer (not shown) defining an active region (not shown) and the floating diffusion region FD may be further formed on the first surface 110F1 of the substrate 11. The photoelectric conversion region 120, the transmission gate TG, a plurality of transistors, and the floating diffusion region FD may constitute the pixel PX described above.

The pixel isolation structure 150 may penetrate through the substrate 110 and physically and electrically isolate one pixel PX from an adjacent pixel PX (e.g., the first pixel PX1 from the second pixel PX2). The pixel isolation structure 150 may extend from the first surface 110F1 of the substrate 110 to the second surface 110F2 of the substrate 110.

In some embodiments, the pixel isolation structure 150 may include a conductive layer 152 and an insulation liner 154. The conductive layer 152 and the insulation liner 154 may each penetrate through the substrate 110 from the first surface 110F1 of the substrate 110 to the second surface 110F2 of the substrate 110. The insulation liner 154 may be disposed between the substrate 110 and the conductive layer 152 to electrically isolate the conductive layer 152 from the substrate 110.

In some embodiments, the conductive layer 152 may include a conductive material like polysilicon or metal. The insulation liner 154 may include a metal oxide like hafnium oxide ($HfO_2$), aluminum oxide ($Al_2O_3$), tantalum oxide ($Ta_2O_5$), etc., and when the insulation liner 154 includes a metal oxide, the insulation liner 154 may serve as a negative fixed charge layer. In some embodiments, the insulation liner 154 may include an insulating material like silicon oxide ($SiO_2$), silicon nitride (SiN), or silicon oxynitride ($N_2OSi_2$).

A front side structure 130 may be disposed on the first surface 110F1 of the substrate 110. The front side structure 130 may include a wire layer 134 and an insulation layer 136. The insulation layer 136 may electrically isolate the wire layer 134 from the first surface 110F1 of the substrate 110.

The wire layer 134 may be electrically connected to transistors on the first surface 110F1 of the substrate 110. The wire layer 134 may include tungsten (W), aluminum (Al), copper (Cu), tungsten silicide ($WSi_2$), titanium silicide ($TiSi_2$), tungsten nitride (WN), titanium nitride (TiN), doped polysilicon, etc. The insulation layer 136 may include an insulation material like silicon oxide, silicon nitride, silicon oxynitride, or a low-k material.

The low-k material may include, for example, at least one of flowable oxide (FOx), torene silazene (TOSZ), undoped silica glass (USG), borosilica glass (BSG), phosphosilica glass (PSG), boro phosphosilica glass (BPSG), plasma enhanced tetra ethyl ortho silicate (PETEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SiLK, polyimide, porous polymeric material, and combinations thereof, but is not limited thereto. Selectively, the supporting substrate 140 may be disposed on the front side structure 130.

An adhesive member (not shown) may be further disposed between the supporting substrate 140 and the front side structure 130. The supporting substrate 140 may correspond to the second substrate 7 of FIG. 1. A logic circuit for driving a pixel circuit may be formed in the supporting substrate 140, and the supporting substrate 140 may support the substrate 110.

The rear side anti-reflective layer 162 may be disposed on the second surface 110F2 of the substrate 110. The rear side anti-reflective layer 162 may be disposed on all pixels PX and the pixel isolation structure 150. In some embodiments, the rear side anti-reflective layer 162 may include hafnium oxide. In some embodiments, the additional rear side anti-reflective layer 164 may include silicon oxide.

In some embodiments, the rear side anti-reflective layer 162 may include silicon nitride (SiN), aluminum oxide ($Al_2O_3$), zirconium oxide ($ZrO_2$), tantalum oxide ($Ta_2O_5$), titanium oxide ($TiO_2$), lanthanum oxide ($La_2O_3$), praseodymium oxide ($Pr_2O_3$), cerium oxide ($CeO_2$), neodymium oxide ($Nd_2O_3$), promethium oxide ($Pm_2O_3$), samarium oxide ($Sm_2O_3$), europium oxide ($Eu_2O_3$), gadolinium oxide ($Gd_2O_3$), terbium oxide ($Tb_2O_3$) dysprosium ($Dy_2O_3$), holmium oxide ($Ho_2O_3$), thulium oxide ($Tm_2O_3$), ytterbium oxide ($Yb_2O_3$), lutetium oxide ($LU_2O_3$), or yttrium oxide ($Y_2O_3$). In some embodiments, the thickness of the rear side anti-reflective layer 162 may be from about 50 nm to about 200 nm.

The fence 163 may be disposed on the rear side anti-reflective layer 162. The fence 163 may be referred to as a grid. As described above, the fence 163 may overlap the pixel isolation structure 150 when viewed from above. In some embodiments, the height of the fence 163 may be from about 300 nm to about 500 nm. In some embodiments, the fence 163 may include a buried air gap AG, a first fence layer 163a, a fence capping layer 163b, and a second fence layer 163c.

In some embodiments, the first fence layer 163a and the second fence layer 163c constituting the fence 163 may include a low refractive index material. In some embodiments, the fence capping layer 163b may include a material having a higher refractive index than a material constituting the first fence layer 163a and the second fence layer 163c. The fence capping layer 163b may be silicon oxide. In some embodiments, the refractive index of the fence capping layer 163b may be from about 1.45 to about 1.55.

In some embodiments, the low refractive index material constituting the first fence layer 163a and the second fence layer 163c may have a refractive index greater than about 1.0 and less than or equal to about 1.4. In some embodiments, the low refractive index material may include polymethylmetacrylate (PMMA), silicon acrylate, cellulose acetate butyrate (CAB), silica, or fluoro-silicon acrylate (FSA). For example, the low refractive index material may include a polymer material in which silica (SiOA) particles are dispersed.

When the fence 163 includes a low refractive index material having a relatively low refractive index, light incident toward the fence 163 may be totally reflected and directed toward the center of the pixel PX. The fence 163 may prevent light incident obliquely into one of the color filters 170 disposed on one pixel PX from entering into another of the color filters 170 disposed on an adjacent pixel PX, thereby preventing crosstalk between a plurality of pixels PX.

The buried air gap AG constituting the fence 163 may have a low refractive index, e.g., about 1.0. The buried air gap AG may be referred to as a buried void. When the fence 163 includes the buried air gap AG having a relatively low refractive index, light incident toward the buried air gap AG may be totally reflected and directed toward the center of the pixel PX. The buried air gap AG may prevent light incident at an inclination angle into one of the color filters 170 disposed on one pixel PX from entering another one of the color filters 170 disposed on an adjacent pixel PX, thereby preventing crosstalk between a plurality of pixels PX.

In some embodiments, the fence 163 may include a penetration PT (or penetration layer), which is connected to the first fence layer 163a and penetrating through a portion of the rear side anti-reflective layer 162. The penetration PT may include the same material as the first fence layer 163a. When the fence 163 includes the penetration PT having a low refractive index, light incident toward the penetration PT may be totally reflected and directed toward the center of the pixel PX. The penetration PT may prevent light incident at an inclination angle into the color filter 170 disposed on one pixel PX from entering the color filter 170 disposed on an adjacent pixel PX, thereby preventing crosstalk between a plurality of pixels PX.

In some embodiments, the additional rear side anti-reflective layer 164 may be provided on the rear side anti-reflective layer 162 and the fence 163. The additional rear side anti-reflective layer 164 may cover the rear side anti-reflective layer 162 and the fence 163. Specifically, the additional rear side anti-reflective layer 164 may be disposed on the top surface of the rear side anti-reflective layer 162, side surfaces of the fence 163, and the top surface of the fence 163.

In some embodiments, the additional rear side anti-reflective layer 164 may include silicon oxide. In some embodiments, the additional rear side anti-reflective layer 164 may include silicon nitride (SiN), hafnium oxide ($HfD_2$), aluminum oxide ($Al_2O_3$), zirconium oxide ($ZrO_2$), tantalum oxide ($Ta_2O_5$), titanium oxide ($TiO_2$), lanthanum oxide ($La_2O_3$), praseodymium oxide ($Pr_2O_3$), cerium oxide ($CeO_2$), neodymium oxide ($Nd_2O_3$), promethium oxide ($Pm_2O_3$), samarium oxide ($Sm_2O_3$), europium oxide ($Eu_2O_3$), gadolinium oxide ($Gd_2O_3$), terbium oxide ($Tb_2O_3$) dysprosium ($Dy_2O_3$), holmium oxide ($Ho_2O_3$), thulium oxide ($Tm_2O_3$), ytterbium oxide ($Yb_2O_3$), lutetium oxide ($Lu_2O_3$), or yttrium oxide ($Y_2O_3$).

The passivation layer 165 may be disposed on the additional rear side anti-reflective layer 164. The passivation layer 165 may protect the additional rear side anti-reflective layer 164, the rear side anti-reflective layer 162, and the fence 163. In some embodiments, the passivation layer 165 may include aluminum oxide. In some embodiments, the thickness of the passivation layer 165 may be from about 5 nm to about 20 nm.

A plurality of color filters 170 may be arranged on the passivation layer 165 and may be separated from one another by the fence 163. In some embodiments, the color filters 170 may be a combination of a green filter, a blue filter, and a red filter. In some embodiments, the color filters 170 may be a combination of a cyan filter, a magenta filter, and a yellow filter.

The micro lens 180 may be disposed on the color filter 170 and the passivation layer 165. The micro lens 180 may be disposed in correspondence to the pixel PX. The micro lens 180 may be transparent. In some embodiments, the micro lens 180 may have a transmittance of 90% or higher for light in the visible ray range. Light in the visible ray range may have a wavelength from about 380 nm to about 770 nm.

In some embodiments, the micro lens 180 may include a resin-based material like a styrene-based resin, an acrylic resin, a styrene-acrylic copolymer resin, or a siloxane-based resin. The micro lens 180 may collect incident light, and collected light may be incident on the photoelectric conversion region 120 through the color filter 170. The capping layer 190 may be disposed on the micro lens 180.

Figure 5:
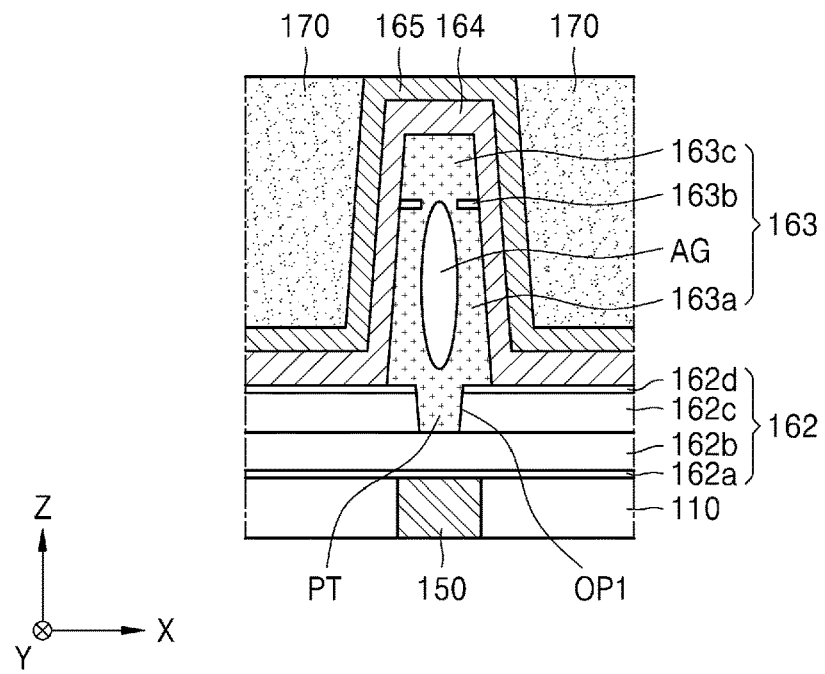
FIG. 5 is an enlarged view of a region EL of FIG. 4.
Figure 6:
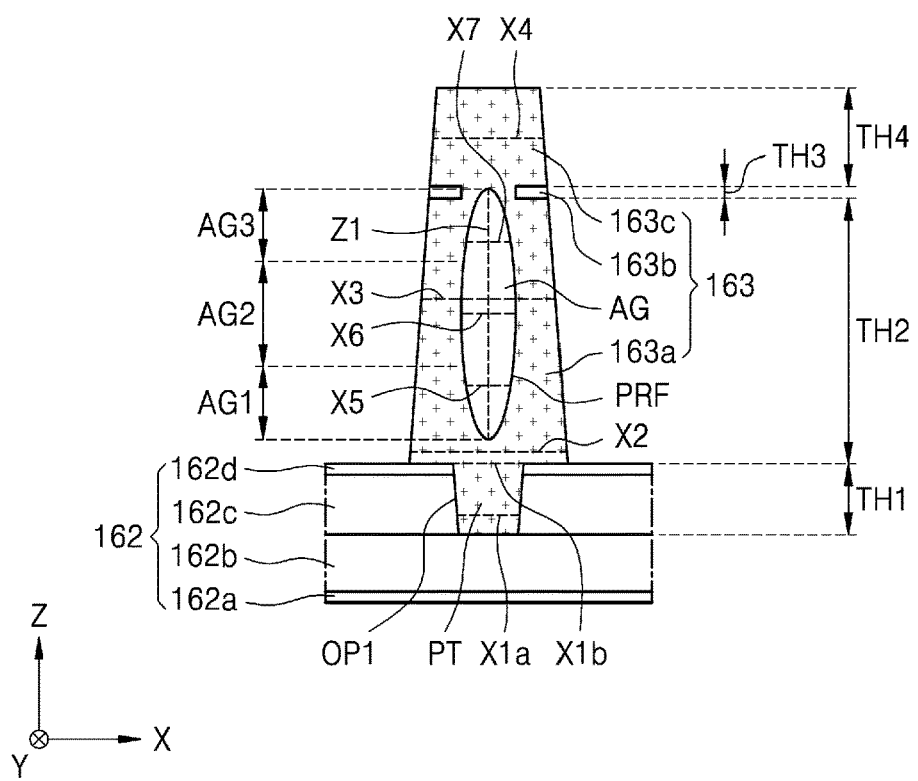
FIG. 6 is a diagram of a fence including a buried air gap of FIG. 5 in detail.

FIG. 5 is an enlarged view of a region EL of FIG. 4, and FIG. 6 is a diagram of a fence including a buried air gap of FIG. 5 in detail.

As shown in FIG. 5, the rear side anti-reflective layer 162 may be formed on the substrate 110 and the pixel isolation structure 150. The rear side anti-reflective layer 162 may include first to fourth sub rear side anti-reflective layers 162a, 162b, 162c, and 162d. Although the rear side anti-reflective layer 162 includes four sub rear side anti-reflective layers (i.e., first to fourth sub rear side anti-reflective layers 162a, 162b, 162c, and 162d) in the present embodiment, the rear side anti-reflective layer 162 may include less or more sub rear side anti-reflective layers.

The sub rear side anti-reflective layers 162a, 162b, 162c, and 162d may include a combination of materials constituting the rear side anti-reflective layer 162 described above. The sub rear side anti-reflective layers 162a, 162b, 162c, and 162d may include a plurality of material layers having different thicknesses.

In some embodiments, the first sub rear side anti-reflective layer 162a may include aluminum oxide ($Al_2O_3$), the second sub rear side anti-reflective layer 162b and the fourth sub rear side anti-reflective layer 162d may include hafnium oxide, and the third sub rear side anti-reflective layer 162c may include silicon oxide.

The fence 163 may be disposed on the rear side anti-reflective layer 162 to correspond to or be aligned with the pixel isolation structure 150 in a direction perpendicular to the substrate 110. The fence 163 may include a plurality of fence layers. In some embodiments, the fence 163 may include the first fence layer 163a, the fence capping layer 163b, and the second fence layer 163c. The fence 163 may include a buried air gap AG formed in the first fence layer 163a.

The first fence layer 163a and the second fence layer 163c may include a low refractive index material. Because the low-refractive-index material is described above, detailed descriptions thereof are omitted. The fence capping layer 163b may include a material (e.g., silicon oxide) having a higher refractive index than the material constituting the first fence layer 163a and the second fence layer 163c. The buried air gap AG may be formed in the first fence layer 163a.

In some embodiments, the fence 163 may include the penetration PT connected to the first fence layer 163a and extruding from the first fence layer 163. The penetration PT is formed in a first opening OP1, and penetrates through at least one of the sub rear side anti-reflective layers 162a, 162b, 162c, and 162d. Although the present embodiment illustrates that the penetration PT penetrates through the third and fourth sub rear side anti-reflective layers 162c and 162d, the penetration PT may also penetrate through all of the sub rear side anti-reflective layers 162a, 162b, 162c, and 162d.

Here, the fence 163 including the buried air gap AG is described in more detail with reference to FIG. 6.

In some embodiments, in the horizontal direction (i.e., the X direction) parallel to a surface of the rear side anti-reflective layer 162, a width X1a of the lower portion of the penetration PT may be smaller than a width X1b of the upper portion of the penetration PT on the rear side anti-reflective layer 162. The penetration PT may have a first thickness TH1 in the vertical direction (i.e., the Z direction) perpendicular to the surface of the rear side anti-reflective layer 162. In some embodiments, the first thickness TH1 may be hundreds of nm.

A width X4 of the second fence layer 163c in the horizontal direction (i.e., X direction) parallel to the surface of the rear side anti-reflective layer 162 may be less than widths X3 and X2 of the first fence layer 163a. A width X3 of the middle portion of the first fence layer 163a on the rear side anti-reflective layer 162 in the horizontal direction (i.e., the X direction) parallel to the surface of the rear side anti-reflective layer 162 may be less than a width X2 of the lower portion of the first fence layer 163a. In some embodiments, the widths X2, X3, and X4 may each be about dozens of nm.

In some embodiments, a thickness of the first fence layer 163a in the vertical direction (i.e., the Z direction) perpendicular to the surface of the rear side anti-reflective layer 162 may have a second thickness TH2 that is greater than the first thickness TH1. In some embodiments, the second thickness TH2 may be about several hundred nm.

A thickness of the fence capping layer 163b in the vertical direction (i.e., the Z direction) perpendicular to the surface of the rear side anti-reflective layer 162 may have a third thickness TH3 that is less than the first thickness TH1 and the second thickness TH2. In some embodiments, the third thickness TH3 may be about several nm.

A thickness of the second fence layer 163c in the vertical direction (i.e., the Z direction) perpendicular to the surface of the rear side anti-reflective layer 162 may be a fourth thickness TH4 that is less than the second thickness TH2 and greater than the third thickness TH3. In some embodiments, the fourth thickness TH4 may be about several hundred nm.

In some embodiments, the buried air gap AG may have a height Z1 in the vertical direction (i.e., the Z direction) perpendicular to the surface of the rear side anti-reflective layer 162, the height Z1 being greater than widths X5, X6, and X7 of the buried air gap AG in a horizontal direction parallel to the surface of the rear side anti-reflective layer 162. The height Z1 may be about several hundred nm, and the widths X5, X6, and X7 may each be about dozens of nm.

In some embodiments, the buried air gap AG may have a bow-shaped profile PRF in the vertical direction (i.e., the Z direction) perpendicular to the surface of the rear side anti-reflective layer 162. In some embodiments, the buried air gap AG may include a lower portion AG1, a middle portion AG2, and an upper portion AG3 in the vertical direction (i.e., the Z direction) perpendicular to the surface of the rear side anti-reflective layer 162. A width X6 of the middle portion AG2 of the buried air gap AG may be greater than the width X5 of the lower portion AG1 and the width X7 of the upper portion AG3 in the horizontal direction (i.e., the X direction) parallel to the surface of the rear side anti-reflective layer 162.

Figure 7:
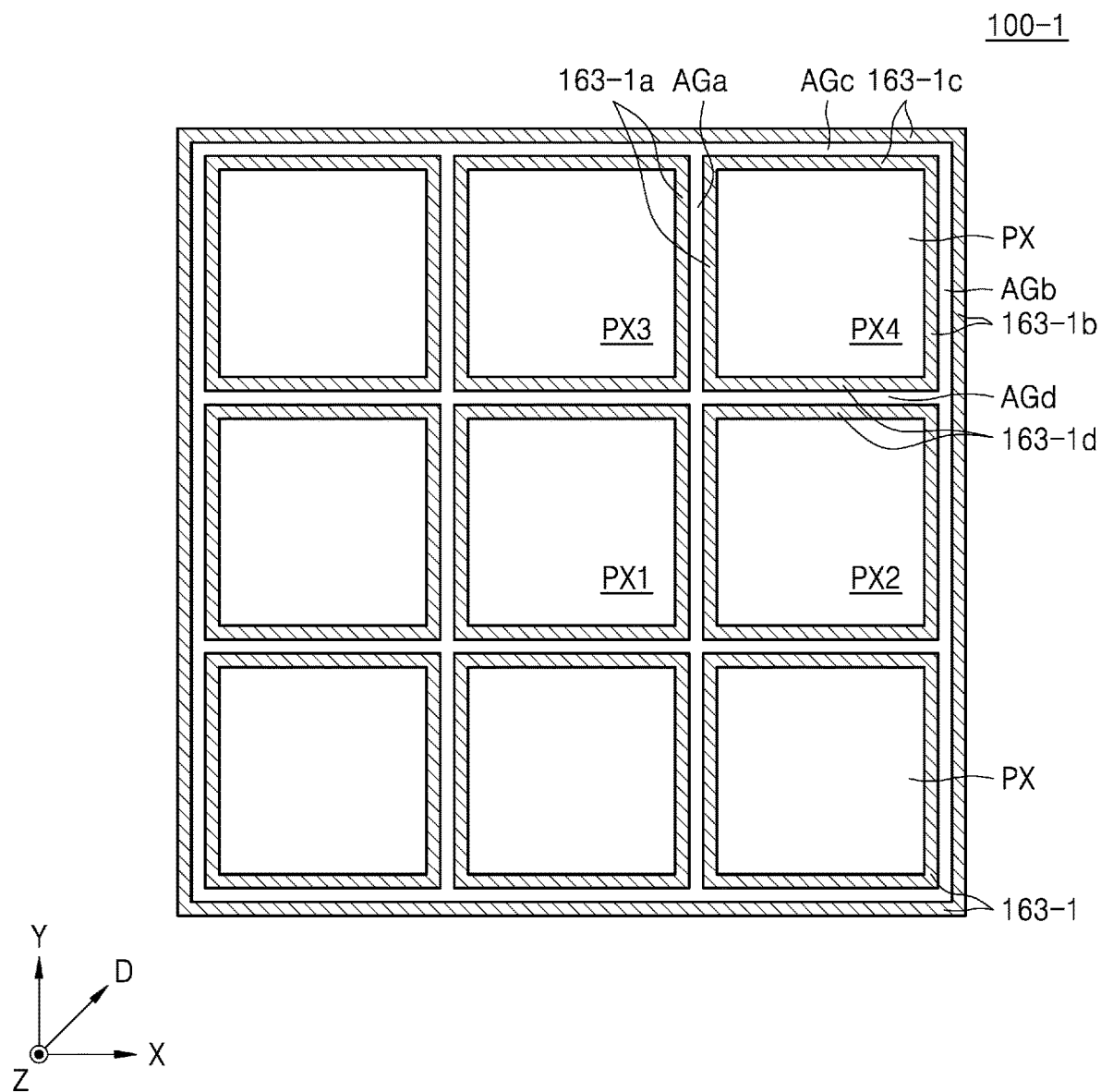
FIG. 7 is a plan view of a fence having a buried air gap of an image sensor according to an embodiment.

FIG. 7 is a plan view of a fence having a buried air gap of an image sensor according to an embodiment.

Specifically, a fence 163-1 of an image sensor 100-1 may correspond to the fence 163 of the image sensor 100 of FIGS. 3 to 6. The image sensor 100-1 may include a plurality of pixels PX, e.g., the first pixel PX1, the second pixel PX2, the third pixel PX3, and the fourth pixel PX4. The pixels PX may be arranged 2-dimensionally and apart from one another. Because the arrangement of the pixels PX has been described above with reference to FIG. 3, detailed description thereof is omitted.

The fence 163-1 may be connected to a pixel PX while completely surrounding the pixel PX. For example, the fence 163-1 may include a first connecting line fence portion 163-1a extending throughout the left side of the fourth pixel PX4 and a second connecting line fence portion 163-1b extending throughout the right side of the fourth pixel PX4.

Also, the fence 163-1 may include a third connecting line fence portion 163-1c extending throughout the upper side of the fourth pixel PX4 and a fourth connecting line fence portion 163-1d extending throughout the lower side of the fourth pixel PX4. The first connecting line fence portion 163-1a, the second connecting line fence portion 163-1b, the third connecting line fence portion 163-1c, and the fourth connecting line fence portion 163-1d may be connected to one another.

The fence 163-1 may include buried air gaps AGa, AGb, AGc, and AGd. The buried air gaps AGa, AGb, AGc, and AGd may constitute as a connected pattern arranged to completely surround the perimeters of the plurality of pixels PX in the fence 163-1 when viewed from above. The buried air gaps AGa, AGb, AGc, and AGd may correspond to the buried air gap AG of FIGS. 4 to 6. The buried air gaps AGa, AGb, AGc, and AGd may be formed at the first connecting line fence portion 163-1a, the second connecting line fence portion 163-1b, the third connecting line fence portion 163-1c, and the fourth connecting line fence portion 163-1d, respectively. Although FIG. 7 shows that the buried air gaps AGa, AGb, AGc, and AGd are connected to one another, they may be located apart from one another.

The fence 163-1 configured as described above may reduce crosstalk by reducing light interference between the pixels PX, e.g., first to fourth pixels PX1, PX2, PX3, and PX4.

Figure 8:
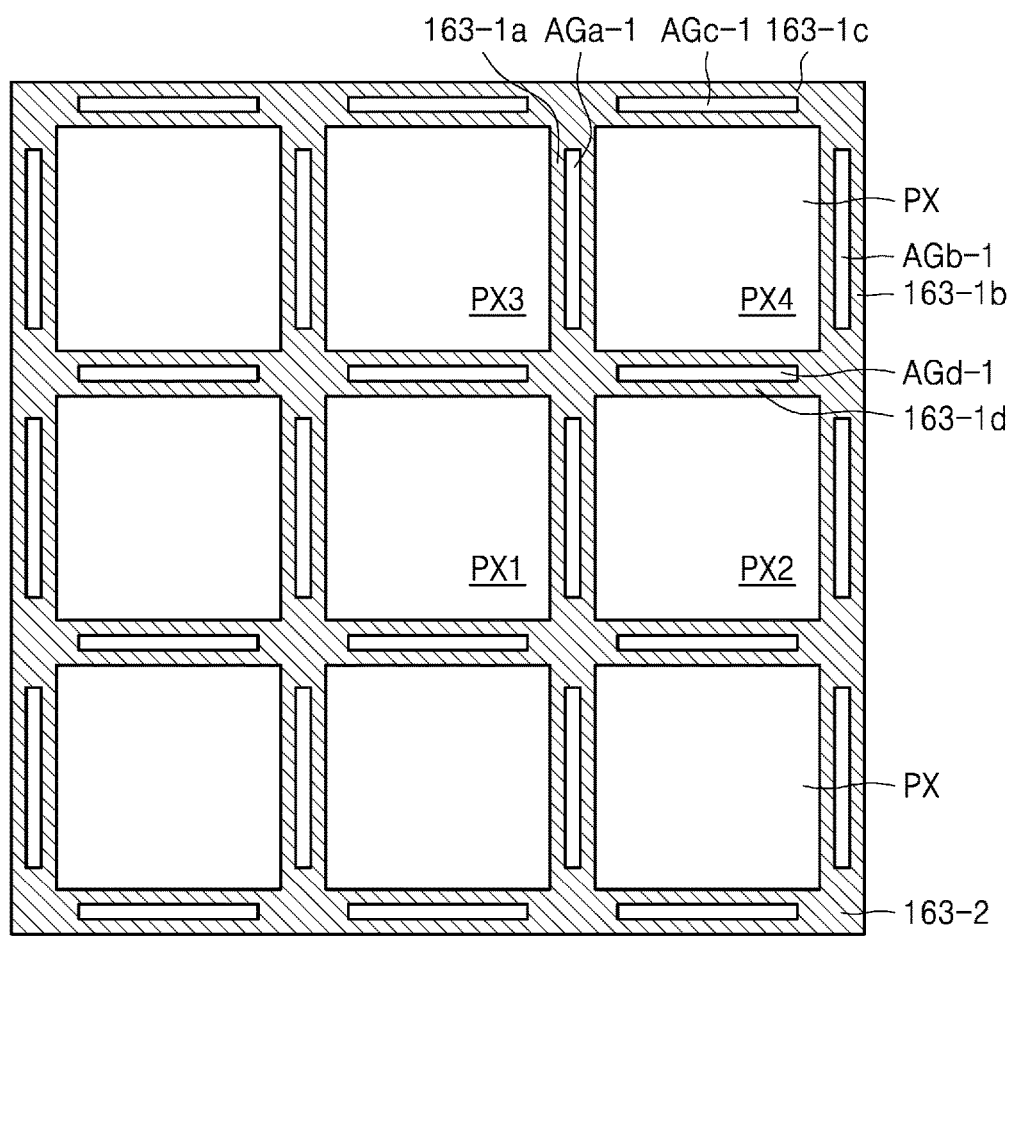
FIG. 8 is a plan view of a fence having a buried air gap of an image sensor according to an embodiment.

FIG. 8 is a plan view of a fence having a buried air gap of an image sensor according to an embodiment.

Referring to FIG. 8, an image sensor 100-2 is identical to the image sensor 100-1 of FIG. 7 except that the arrangement or the shapes of the buried air gaps AGa, AGb, AGe, and AGd in the fence 163-2. With reference to FIG. 8, descriptions identical to those given above with reference to FIG. 7 are briefly given or omitted.

The image sensor 100-2 may include a plurality of pixels PX, e.g., the first pixel PX1, the second pixel PX2, the third pixel PX3, and the fourth pixel PX4. For example, the image sensor 100-2 may include buried air gaps AGa-1, AGb-1, AGc-1, and AGd-1 that are arranged apart from one another around the fourth pixel PX4. While an example is provided above with respect to the fourth pixel PX4, the buried air gaps may be disposed around other pixels including the first pixel PX1, the second pixel PX2 and the third pixel PX3 in a manner similar to the fourth pixel PX4. The buried air gaps AGa-1, AGb-1, AGc-1, and AGd-1 may constitute as a separated pattern arranged to partially surround the perimeters of the plurality of pixels PX in the fence 163-1 when viewed from above.

The buried air gaps AGa-1, AGb-1, AGc-1, and AGd-1 may be formed at the first connecting line fence portion 163-1a, the second connecting line fence portion 163-1b, the third connecting line fence portion 163-1c, and the fourth connecting line fence portion 163-1d, respectively.

The fence 163-5 configured as described above may reduce crosstalk by reducing light interference between the pixels PX, e.g., first to fourth pixels PX1, PX2, PX3, and PX4.

Figure 9:
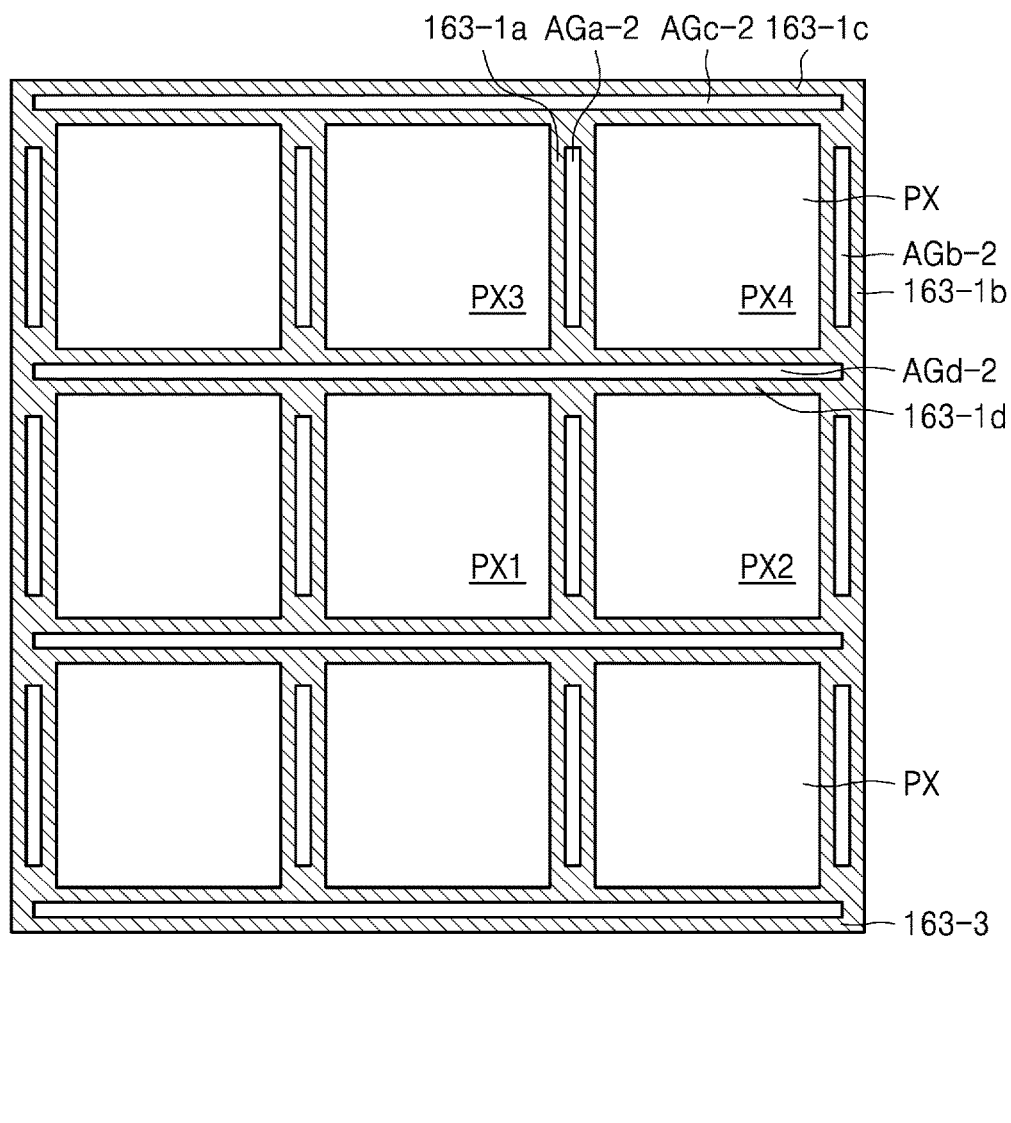
FIG. 9 is a plan view of a fence having a buried air gap of an image sensor according to an embodiment.

FIG. 9 is a plan view of a fence having a buried air gap of an image sensor according to an embodiment.

Referring to FIG. 9, an image sensor 100-3 is the same as the image sensors 100-1 and 100-2 of FIGS. 7 and 8 except that the arrangement or the shapes of buried air gaps AGa-2, AGb-2, AGc-2, and AGd-2 in a fence 163-3 is different from those of the image sensors 100-1 and 100-2. With reference to FIG. 9, descriptions identical to those given above with reference to FIGS. 7 and 8 are briefly given or omitted.

The image sensor 100-3 may include a plurality of pixels PX, e.g., the first pixel PX1, the second pixel PX2, the third pixel PX3, and the fourth pixel PX4. For example, the image sensor 100-3 may include the buried air gaps AGa-2, AGb-2, AGc-2, and AGd-2 that are arranged apart from one another around the fourth pixel PX4. While an example is provided above with respect to the fourth pixel PX4, the buried air gaps may be disposed around other pixels including the first pixel PX1, the second pixel PX2 and the third pixel PX3 in a manner similar to the fourth pixel PX4.

The buried air gaps AGa-2, AGb-2, AGc-2, and AGd-2 may be formed at the first connecting line fence portion 163-1a, the second connecting line fence portion 163-1b, the third connecting line fence portion 163-1c, and the fourth connecting line fence portion 163-1d, respectively. The buried air gaps AGa-2, AGb-2, AGc-2, and AGd-2 may constitute as a mixed (or hybrid) pattern arranged to completely and partially surround the perimeters of the plurality of pixels PX in the fence 163-3 when viewed from above.

Here, the buried air gaps AGc-2 and AGd-2 may be arranged to extend in the X direction parallel to the third connecting line fence portion 163-1c and the fourth connecting line fence portion 163-1d, respectively. The buried air gaps AGc-2 and AGd-2 may be arranged between the first pixel PX1 and the third pixel PX3 and between the second pixel PX2 and the fourth pixel PX4 and extend in the X direction, respectively.

The fence 163-3 configured as described above may reduce crosstalk by reducing light interference between the pixels PX, e.g., the first to fourth pixels PX1, PX2, PX3, and PX4.

Figure 10:
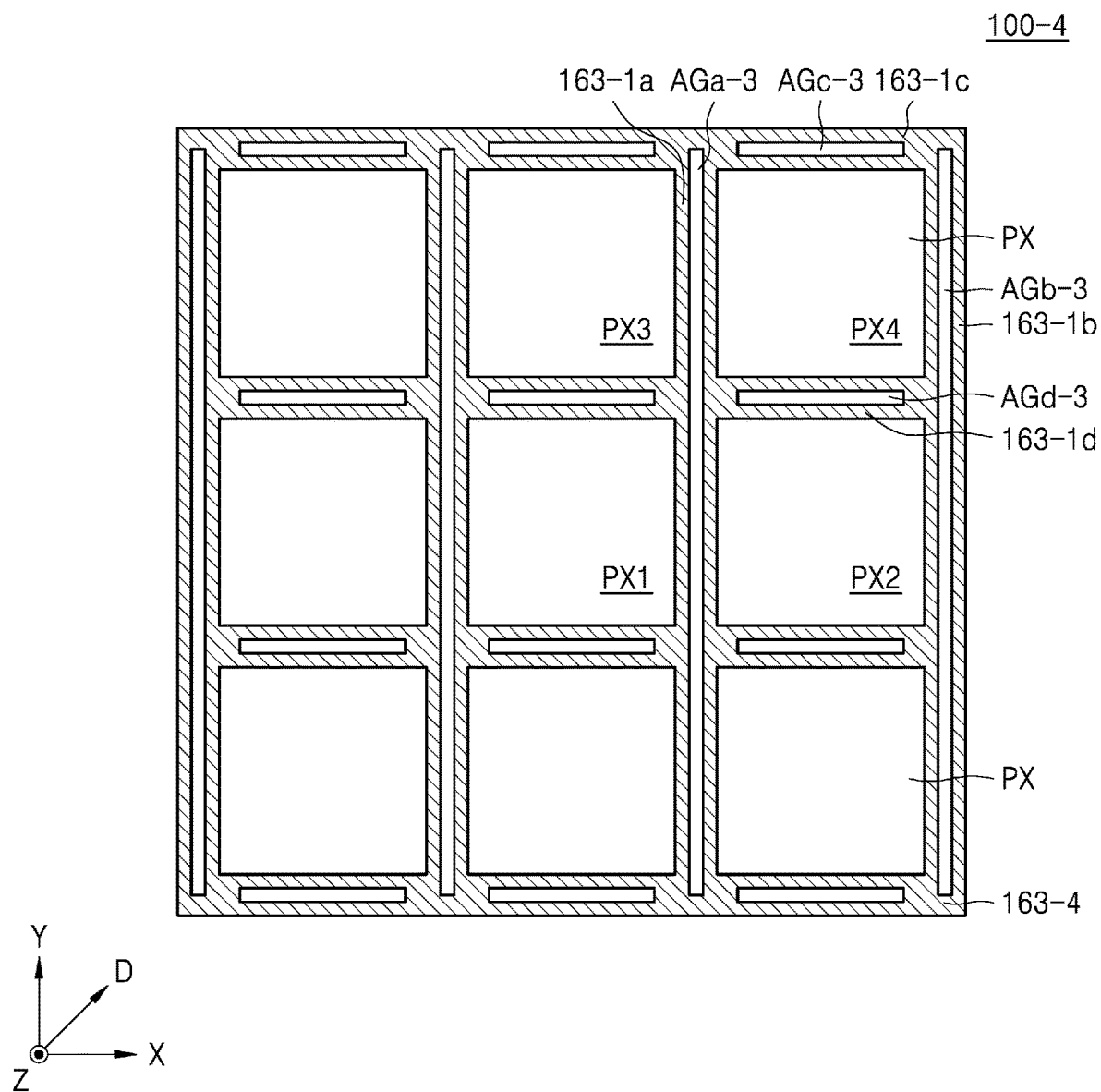
FIG. 10 is a plan view of a fence having a buried air gap of an image sensor according to an embodiment.

FIG. 10 is a plan view of a fence having a buried air gap of an image sensor according to an embodiment.

Referring to FIG. 10, an image sensor 100-4 is the same as the image sensors 100-1 and 100-2 of FIGS. 7 and 8 except that the arrangement or the shapes of buried air gaps AGa-3, AGb-3, AGc-3, and AGd-3 of a fence 163-4 is different from those of the image sensors 100-1 and 100-2. With reference to FIG. 10, descriptions identical to those given above with reference to FIGS. 7 and 8 are briefly given or omitted.

The image sensor 100-4 may include a plurality of pixels PX, e.g., the first pixel PX1, the second pixel PX2, the third pixel PX3, and the fourth pixel PX4. For example, the image sensor 100-4 may include buried air gaps AGa-3, AGb-3, AGc-3, and AGd-3 that are arranged apart from one another around the fourth pixel PX4. While an example is provided above with respect to the fourth pixel PX4, the buried air gaps may be disposed around other pixels including the first pixel PX1, the second pixel PX2 and the third pixel PX3 in a manner similar to the fourth pixel PX4.

The buried air gaps AGa-3, AGb-3, AGc-3, and AGd-3 may be formed at the first connecting line fence portion 163-1a, the second connecting line fence portion 163-1b, the third connecting line fence portion 163-1c, and the fourth connecting line fence portion 163-1d, respectively. The buried air gaps AGa-3, AGb-3, AGc-3, and AGd-3 may constitute as a mixed pattern arranged to completely and partially surround the perimeters of the plurality of pixels PX in the fence 163-4 when viewed from above.

Here, the buried air gaps AGa-3 and AGc-3 may be arranged to extend in the Y direction parallel to the first connecting line fence portion 163-1a and the second connecting line fence portion 163-1b, respectively. The buried air gaps AGa-3 and AGc-3 may be arranged between the first pixel PX1 and the second pixel PX2 and between the third pixel PX3 and the fourth pixel PX4 and extend in the Y direction, respectively.

The fence 163-4 configured as described above may reduce crosstalk by reducing light interference between the pixels PX, e.g., first to fourth pixels PX1, PX2, PX3, and PX4.

Figure 11:
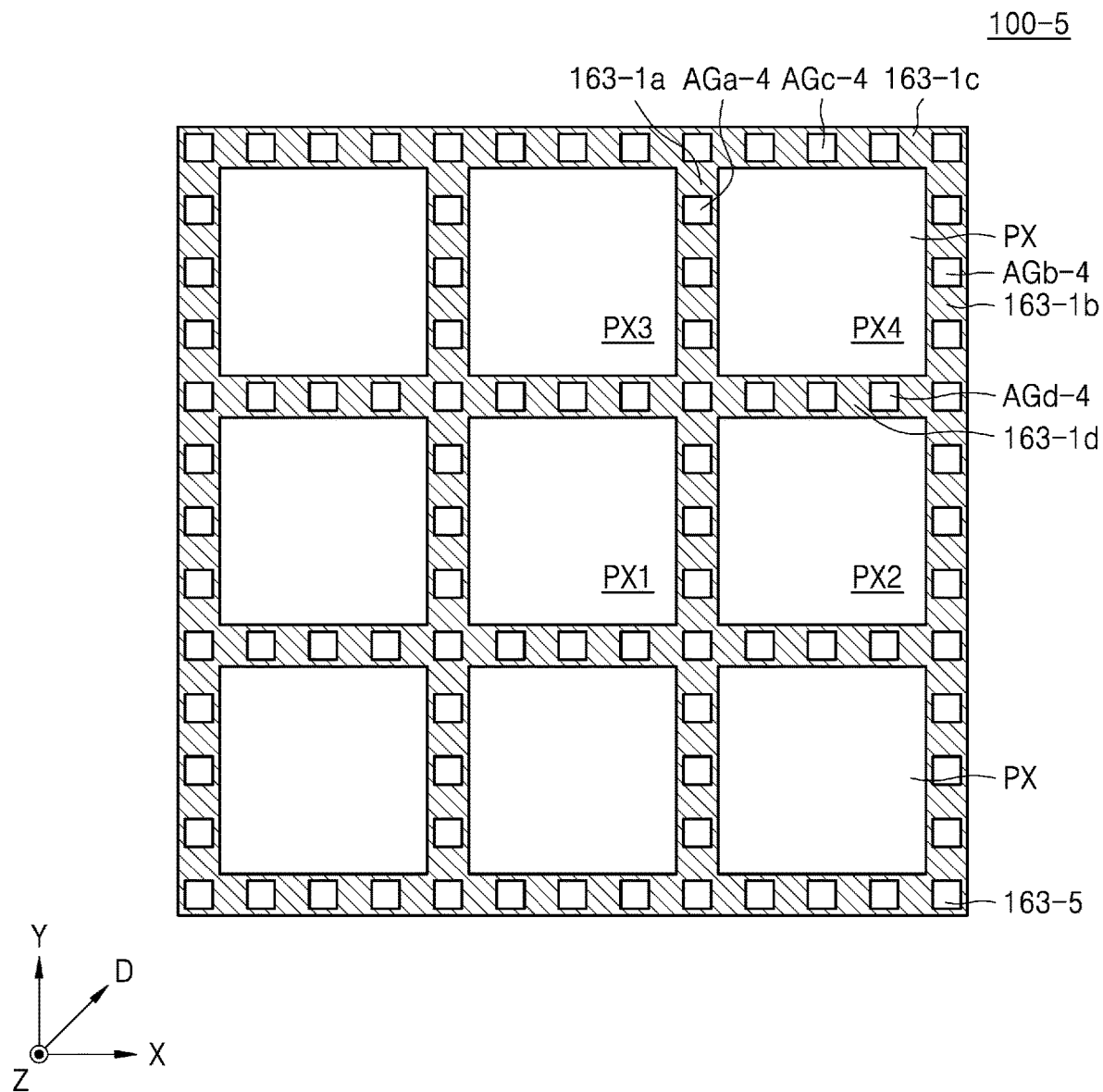
FIG. 11 is a plan view of a fence having a buried air gap of an image sensor according to an embodiment.

FIG. 11 is a plan view of a fence having a buried air gap of an image sensor according to an embodiment.

Referring to FIG. 11, the image sensor 100-5 is identical to the image sensor 100-1 of FIG. 7 except that the arrangement or the shapes of the buried air gaps AGa-4, AGb-4, AGc-4, and AGd-4 in the fence 163-5. With reference to FIG. 11, descriptions identical to those given above with reference to FIG. 7 are briefly given or omitted.

The image sensor 100-5 may include a plurality of pixels PX, e.g., the first pixel PX1, the second pixel PX2, the third pixel PX3, and the fourth pixel PX4. The image sensor 100-5 may include the buried air gaps AGa-4, AGb-4, AGc-4, and AGd-4 that are arranged apart from one another around the first pixel PX1, the second pixel PX2, the third pixel PX3, and the fourth pixel PX4, respectively.

The buried air gaps AGa-4, AGb-4, AGc-4, and AGd-4 may be formed at the first connecting line fence portion 163-1a, the second connecting line fence portion 163-1b, the third connecting line fence portion 163-1c, and the fourth connecting line fence portion 163-1d, respectively.

Here, the buried air gaps AGa-4, AGb-4, AGc-4, and AGd-4 may have a dot-like shape surrounding the pixel PX. The buried air gaps AGa-4, AGb-4, AGc-4, and AGd-4 may be in the form of a plurality of dots (a dot pattern) spaced apart from one another at a predetermined interval. While the buried air gaps AGa-4, AGb-4, AGc-4 and AGd-4 are provided as examples of dot-like buried air gaps, the plurality of dots may include more than these four buried air gaps as shown in FIG. 11.

The fence 163-5 configured as described above may reduce crosstalk by reducing light interference between the pixels PX, e.g., first to fourth pixels PX1, PX2, PX3, and PX4.

Figure 12:
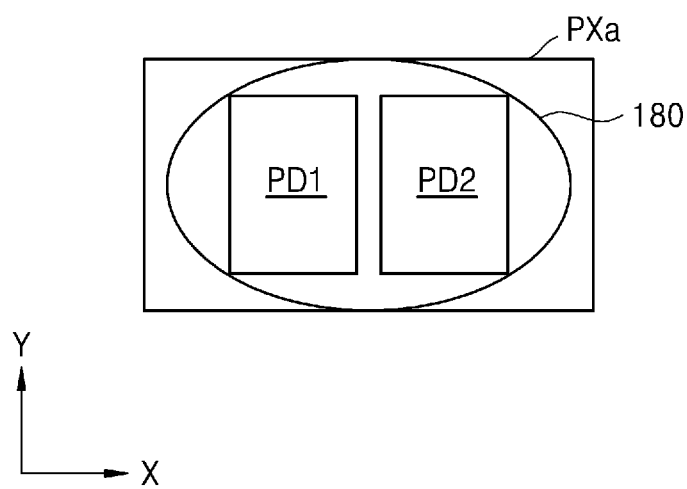
FIG. 12 is a plan view of pixels in an image sensor according to an embodiment.

FIG. 12 is a plan view of pixels in an image sensor according to an embodiment.

Referring to FIG. 12, an image sensor 100-6 is the same as the image sensor 100 of FIGS. 3 to 6 except that two photoelectric conversion elements PD1 and PD2 are included in a pixel PXa. With reference to FIG. 12, descriptions identical to those given above with reference to FIGS. 3 to 6 are briefly given or omitted.

The image sensor 100-6 may include the pixel PXa. The pixel PXa may correspond to the pixel PX of FIG. 3. The pixel PXa may include a first photoelectric conversion element PD1 and a second photoelectric conversion element PD2.

A color filter (170 of FIG. 4) may be disposed under the micro lens 180, and the first photoelectric conversion elements PD1 and the second photoelectric conversion element PD2 may be arranged under the color filter 170. The first photoelectric conversion element PD1 and the second photoelectric conversion element PD2 may be formed on a substrate (110 of FIG. 4). In the present embodiment, the first photoelectric conversion element PD1 and the second photoelectric conversion element PD2 may be arranged side by side under the micro lens 180. For example, the pixel PXa of the image sensor 100-6 may include the two photoelectric conversion elements PD1 and PD2 and may be used as a focusing pixel.

Figure 13:
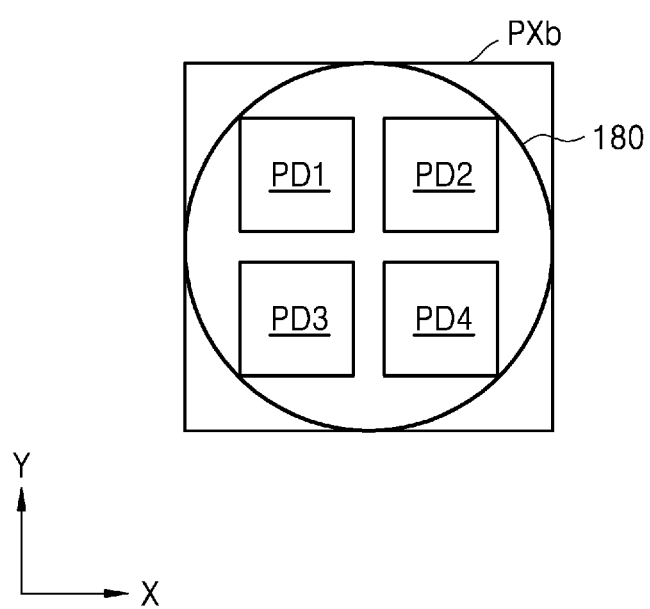
FIG. 13 is a plan view of pixels in an image sensor according to an embodiment.

FIG. 13 is a plan view of pixels in an image sensor according to an embodiment.

Referring to FIG. 13, an image sensor 100-7 is the same as the image sensor 100 of FIGS. 3 to 6 except that four photoelectric conversion elements PD1. PD2, PD3, and PD4 are included in a pixel PXb. With reference to FIG. 13, descriptions identical to those given above with reference to FIGS. 3 to 6 are briefly given or omitted.

The image sensor 100-7 may include the pixel PXb. The pixel PXb may correspond to the pixel PX of FIG. 3. The pixel PXb may include a first photoelectric conversion element PD1, a second photoelectric conversion element PD2, a third photoelectric conversion element PD3, and a fourth photoelectric conversion element PD4.

A color filter (170 of FIG. 4) may be disposed under the micro lens 180, and first to fourth photoelectric conversion elements PD1 to PD4 may be arranged under the color filter 170. The first to fourth photoelectric conversion elements PD1, PD2, PD3, and PD4 may be formed on a substrate (110 of FIG. 4). In the present embodiment, the first to fourth photoelectric conversion elements PD1 to PD4 may be arranged side by side under the micro lens 180. In this regard, the pixel PXb of the image sensor 100-7 may include the four photoelectric conversion elements PD1 to PD4 and may be used as a focusing pixel.

FIGS. 14A to 14D are cross-sectional views showing a method of manufacturing a fence constituting the image sensor of FIGS. 3 to 6.

Figure 14A:
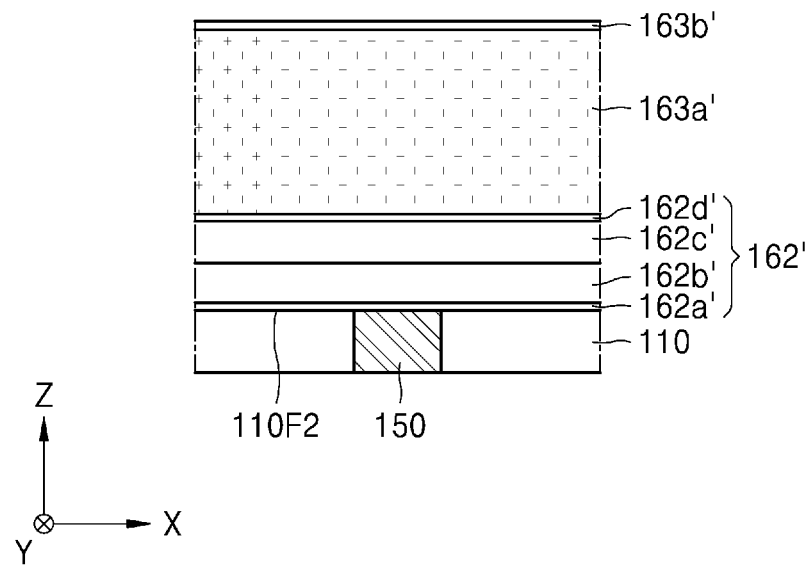
FIGS. 14A to 14D are cross-sectional views showing a method of manufacturing a fence constituting the image sensor of FIGS. 3 to 6.

Referring to FIG. 14A, a rear side anti-reflective material layer 162' is formed on the second surface 110F2 of the substrate 110 including the pixel isolation structure 150. The rear side anti-reflective material layer 162' may include a plurality of sub rear side anti-reflective material layers 162a', 162b', 162c', and 162d'. The sub rear side anti-reflective material layers 162a', 162b', 162c', and 162d' may include first to fourth sub rear side anti-reflective material layers 162a', 162b', 162c', and 162d'.

A first fence material layer 163a' and a fence capping material layer 163b' are formed on the rear side anti-reflective material layer 162'. The first fence material layer 163a' may include a low refractive index material. The fence capping material layer 163b' may be a material layer different from the first fence material layer 163a'. The fence capping material layer 163b' is formed to have a thickness less than that of the first fence material layer 163a'.

Figure 14B:
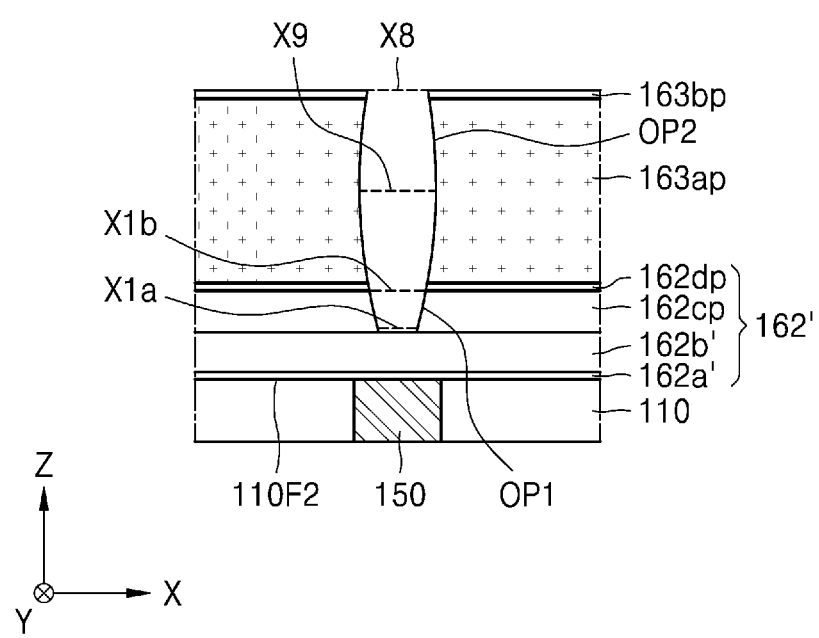

Referring to FIG. 14B, the fence capping material layer 163b', the first fence material layer 163a', and third and fourth sub rear side anti-reflective material layers 162c' and 162d', which are portions of the rear side anti-reflective material layer 162', are patterned through a photolithography process. In the above-stated patterning process, the fence capping material layer 163b' may serve as an etch stop layer that prevents the first fence material layer 163a' from being overly etched.

The fence capping material layer 163b' may be a material layer for a second opening (OP2 of FIG. 14B) to have a vertical profile having a bowing shape as the first fence material layer 163a' shrinks during a process of forming a first fence material pattern 163ap, e.g., etching of the first fence material layer 163a' and ashing and stripping of a mask pattern (not shown). When the second opening (OP2 of FIG. 14B) has a vertical profile having a bowing shape, an air gap (AG of FIG. 14C) may be formed with an optimized size (that is, the maximum size) inside the second opening (OP2 of FIG. 14B).

Therefore, third and fourth sub rear side anti-reflective patterns 162cp and 162dp, a first fence material pattern 163ap, and a fence capping material pattern 163bp are formed on a second sub rear side anti-reflective material layers 162b'. Also, a first opening OP1 may be formed between the third and fourth sub rear side anti-reflective patterns 162cp and 162dp, and a second opening OP2 may be formed between the first fence material patterns 163ap and the fence capping material patterns 163bp. The first opening OP1 and the second opening OP2 may communicate with each other.

The upper portion of the second opening OP2 may have a width X8. The middle portion of the second opening OP2 may have a width X9. The width X9 of the middle portion of the second opening OP2 may be greater than the width X8 of the upper portion of the second opening OP2.

The lower portion of the second opening OP2 and the upper portion of the first opening OP1 may each have a width X1b on the rear side anti-reflective material layer 162'. A width X1b of the lower portion of the second opening OP2 may be less than the width X9 of the middle portion of the second opening OP2.

The lower portion of the first opening OP1 may have a width X1a on the rear side anti-reflective material layer 162'. The width X1b of the upper portion of the first opening OP1 may be greater than the width X1a of the lower portion of the first opening OP1.

Figure 14C:
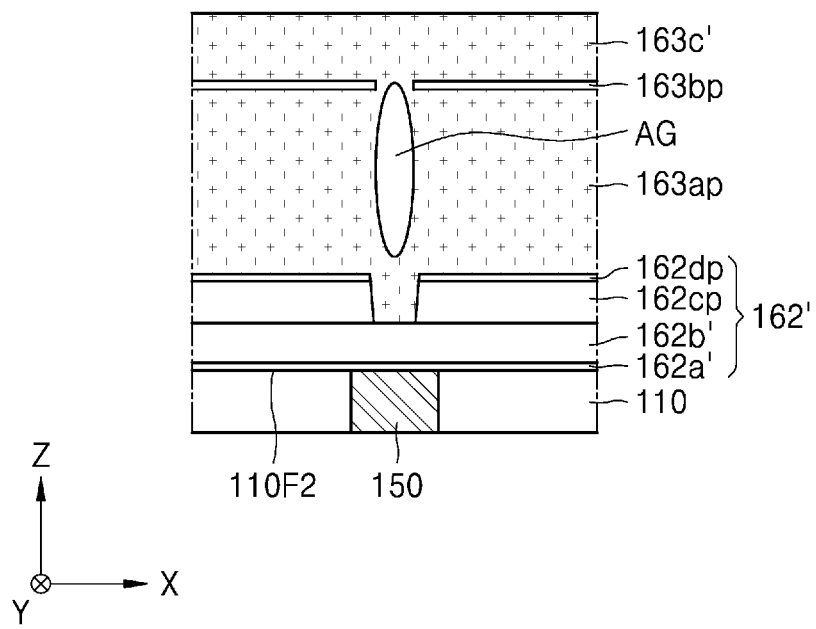

Referring to FIG. 14C, a second fence material layer 163c' partially filling the second opening OP2 and the first opening OP1 is formed on the fence capping material pattern 163bp. The second fence material layer 163' may include a material having poor step coverage. The second fence material layer 163c' may include a low refractive index material. When the second fence material layer 163c' has poor step coverage, an air gap AG may be formed in the first fence material pattern 163ap.

Figure 14D:
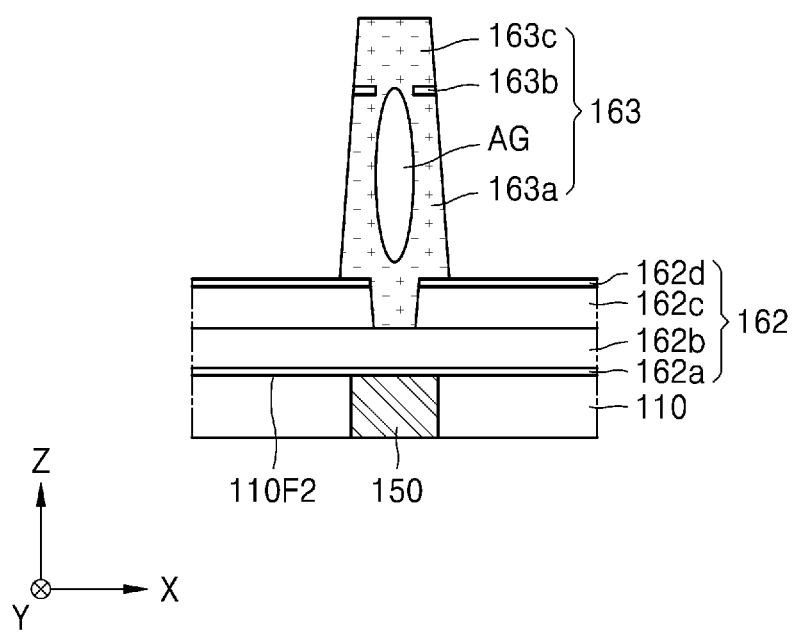

Referring to FIG. 14D, the second fence material layer 163c', the fence capping material pattern 163bp, and the first fence material pattern 163ap are patterned through a photolithography process. Therefore, the fence 163 including the second fence layer 163c, the fence capping layer 163b, the first fence layer 163a, and the air gap AG positioned in the first fence layer 163a is formed.

Finally, in FIG. 14D, first and second sub rear side anti-reflective material layers 162a' and 162b' of FIG. 14C may be referred to as first and second sub rear side anti-reflective layers 162a and 162b. The third and fourth sub rear side anti-reflective patterns 162cp and 162dp of FIG. 14C may be referred to as third and fourth sub rear side anti-reflective layers 162c and 162d. The rear side anti-reflective material layer 162' may be referred to as the rear side anti-reflective layer 162.

Figure 15:
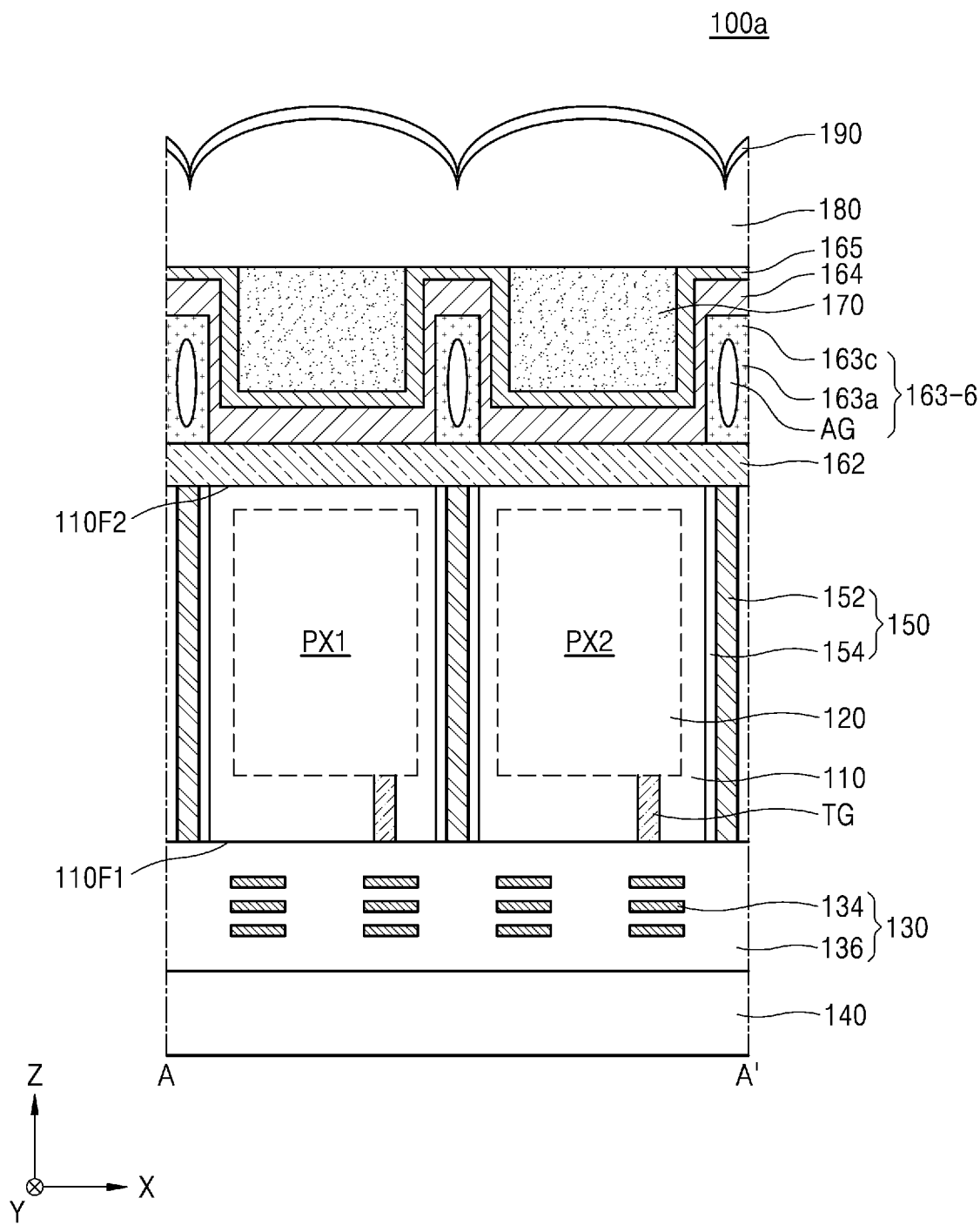
FIG. 15 is a cross-sectional view of an image sensor according to an embodiment.

FIG. 15 is a cross-sectional view of an image sensor according to an embodiment.

Referring to FIG. 15, an image sensor 100a may be the same as the image sensor 100 of FIGS. 3 to 6 except that a fence 163-6 does not include a penetration (PT of FIG. 4) and a fence capping layer (163b of FIG. 4). With reference to FIG. 15, descriptions identical to those given above with reference to FIGS. 3 to 6 are briefly given or omitted.

In the image sensor 100a, the fence 163-6 may be formed on the rear side anti-reflective layer 162. The fence 163-6 may include the buried air gap AG, the first fence layer 163a, and the second fence layer 163c. The first fence layer 163a and the second fence layer 163c may include the same material. The first fence layer 163a and the second fence layer 163c may include a low refractive index material. The additional rear side anti-reflective layer 164 and the passivation layer 165 may be arranged on the rear side anti-reflective layer 162 and the fence 163-6.

The color filter 170, which is separated by the fence 163-6, may be formed on the passivation layer 165. The micro lens 180 and the capping layer 190 may be formed on the color filter 170 and the passivation layer 165. The image sensor 100a configured as described above may reduce crosstalk between pixels by simplifying the configuration of the fence 163-6.

Figure 16:
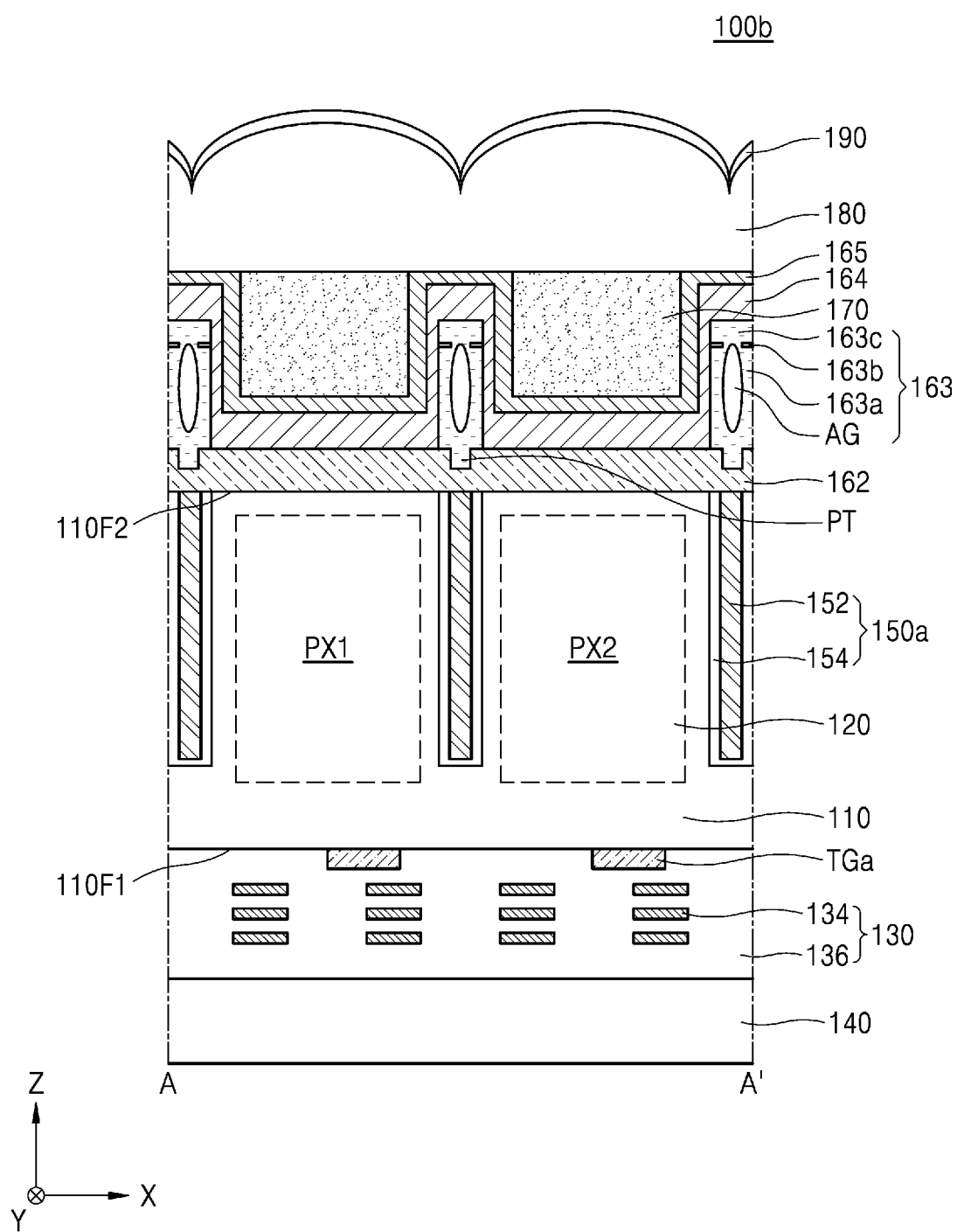
FIG. 16 is a cross-sectional view of an image sensor according to an embodiment.

FIG. 16 is a cross-sectional view of an image sensor according to an embodiment.

Referring to FIG. 16, an image sensor 100b may be the same as the image sensor 100 of FIGS. 3 to 6 except that the image sensor 100b includes a pixel isolation structure 150a and a transmission gate TGa. With reference to FIG. 16, descriptions identical to those given above with reference to FIGS. 3 to 6 are briefly given or omitted.

The image sensor 100b may include the pixel isolation structure 150a instead of the pixel isolation structure 150 in FIG. 4. The pixel isolation structure 150a may not completely penetrate through the substrate 110. The pixel isolation structure 150a extends from the second surface 110F2 of the substrate 110 into the substrate 110, but may not reach the first surface 110F1 of the substrate 110.

Furthermore, the image sensor 100b may include the transmission gate TGa instead of the transmission gate TG (FIG. 4). The transmission gate TGa is formed on the first surface 110F1 of the substrate 110 and may not be recessed into the substrate 110 compared to the transmission gate TG of FIG. 4. The image sensor 100b configured as described above may reduce crosstalk between pixels while diversifying the configurations of the pixel isolation structure 150a and the transmission gate TGa.

Figure 17:
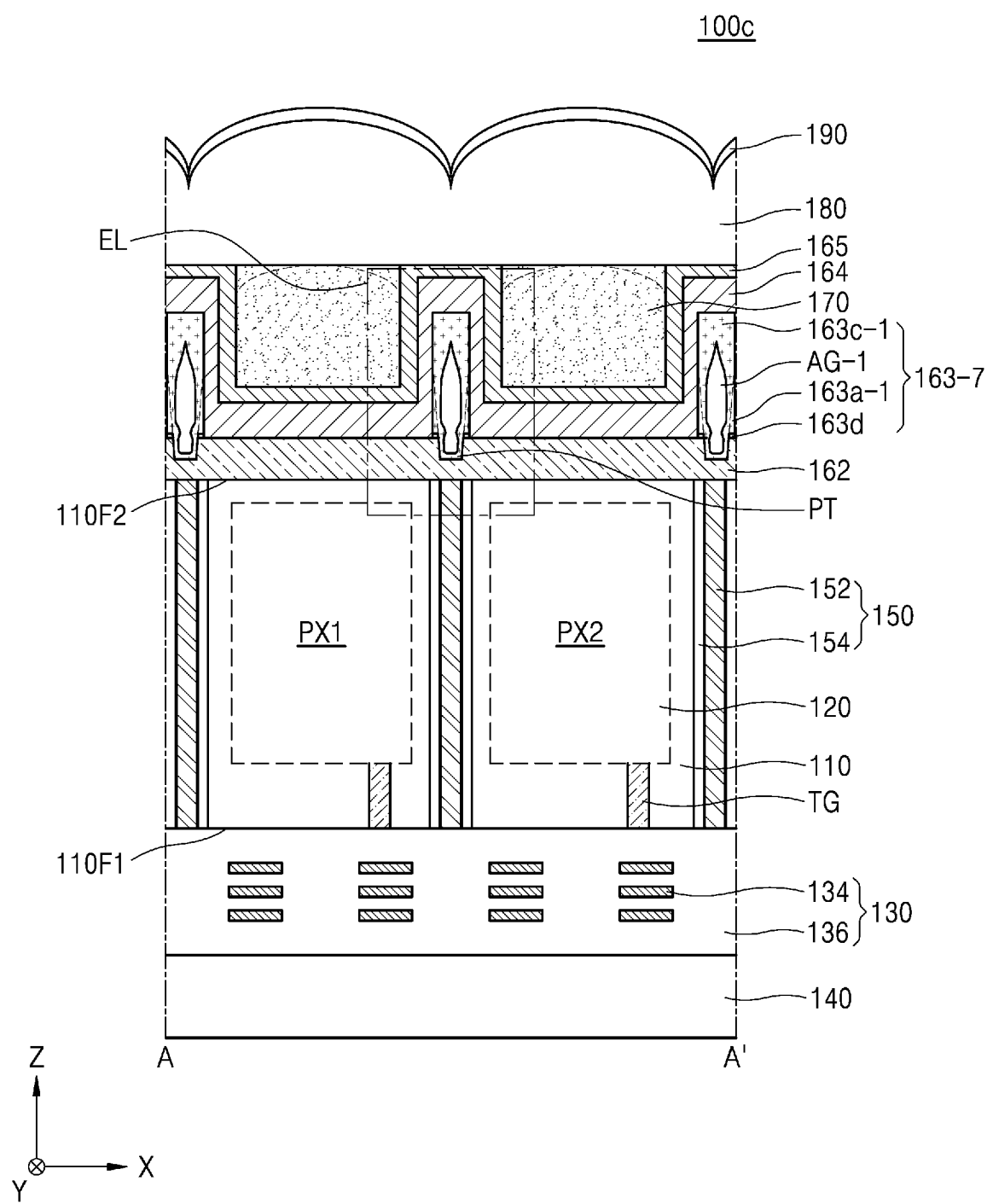
FIG. 17 is a cross-sectional view of an image sensor according to an embodiment.

FIG. 17 is a cross-sectional view of an image sensor according to an embodiment.

Referring to FIG. 17, an image sensor 100c may be identical to the image sensor 100 of FIGS. 3 to 6 except that a buried air gap AG-1 is further extends into the penetration PT and a barrier metal layer 163d is formed on both sides of the buried air gap AG-1 on the rear side anti-reflective layer 162. In FIG. 17, the same or similar reference numerals as those of FIGS. 3 to 6 denote the same or similar reference elements. With reference to FIG. 17, descriptions identical or similar to those given above with reference to FIGS. 3 to 6 are briefly given or omitted.

In the image sensor 100c, a fence 163-7 may be formed on the rear side anti-reflective layer 162. The fence 163-7 may include the buried air gap AG-1, a first fence layer 163a-1, a second fence layer 163c-1, and the barrier metal layer 163d.

The buried air gap AG-1 may be disposed both inside the fence 163-7 on the rear side anti-reflective layer 162 and inside the penetration PT. The buried air gap AG-1 may be disposed inside the first fence layer 163a-1 and the second fence layer 163c-1. In particular, the buried air gap AG-1 may be disposed inside the second fence layer 163c-1. When the buried air gap AG-1 is disposed inside the penetration PT, an occupation ratio of buried air gaps in the fence 163-7 may be increased, thereby further reducing crosstalk between pixels.

The first fence layer 163a-1 may have an upwardly sloped surface on the penetration PT. The second fence layer 163c-1 may constitute the penetration PT. The second fence layer 163c-1 may be formed on the first fence layer 163a-1. The first fence layer 163a-1 and the second fence layer 163c-1 may include the same material. The first fence layer 163a-1 and the second fence layer 163c-1 may include a low refractive index material.

The barrier metal layer 163d may be disposed on both sides of the buried air gap AG-1 on the rear side anti-reflective layer 162. The barrier metal layer 163d may include a metal material, e.g., TiN. The barrier metal layer 163d may be disposed on both sides of the penetration PT. The barrier metal layer 163d may be located below the lower portion of the fence 163-7, that is, the first fence layer 163a-1. When the barrier metal layer 163d is provided, an electrostatic defect of the image sensor 100c like a bruising defect may be reduced.

The additional rear side anti-reflective layer 164 and the passivation layer 165 may be disposed on the rear side anti-reflective layer 162 and the fence 163-7. The color filter 170, which is separated by the fence 163-7, may be formed on the passivation layer 165. The micro lens 180 and the capping layer 190 may be formed on the color filter 170 and the passivation layer 165.

In the image sensor 100c configured as described above, the fence 163-7 is also formed in the penetration PT and the barrier metal layer 163d is included, and thus both crosstalk between pixels and electrostatic defects (e.g., a bruising defect) may be reduced.

Figure 18:
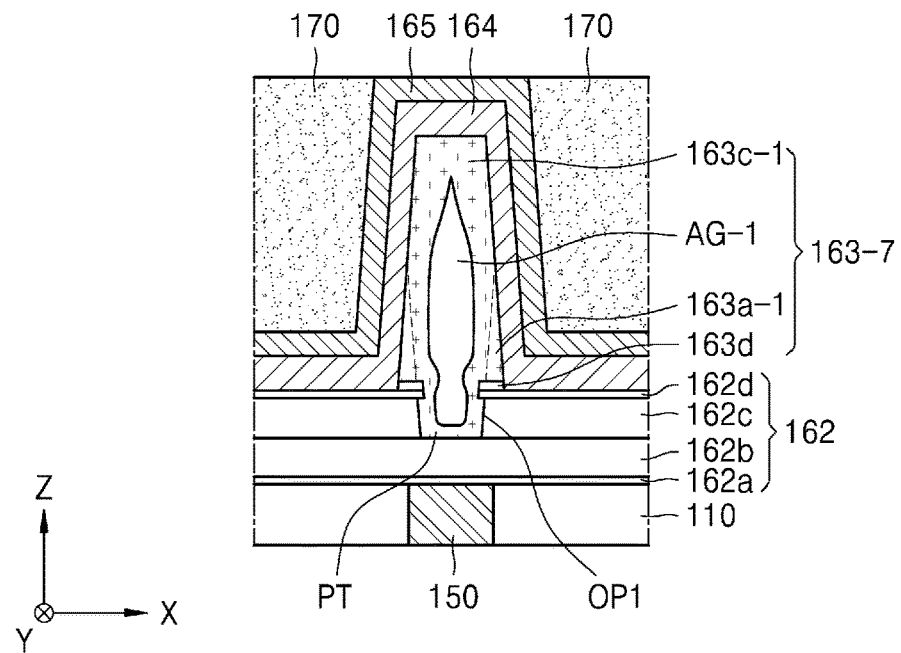
FIG. 18 is an enlarged view of a region EL of FIG. 17.
Figure 19:
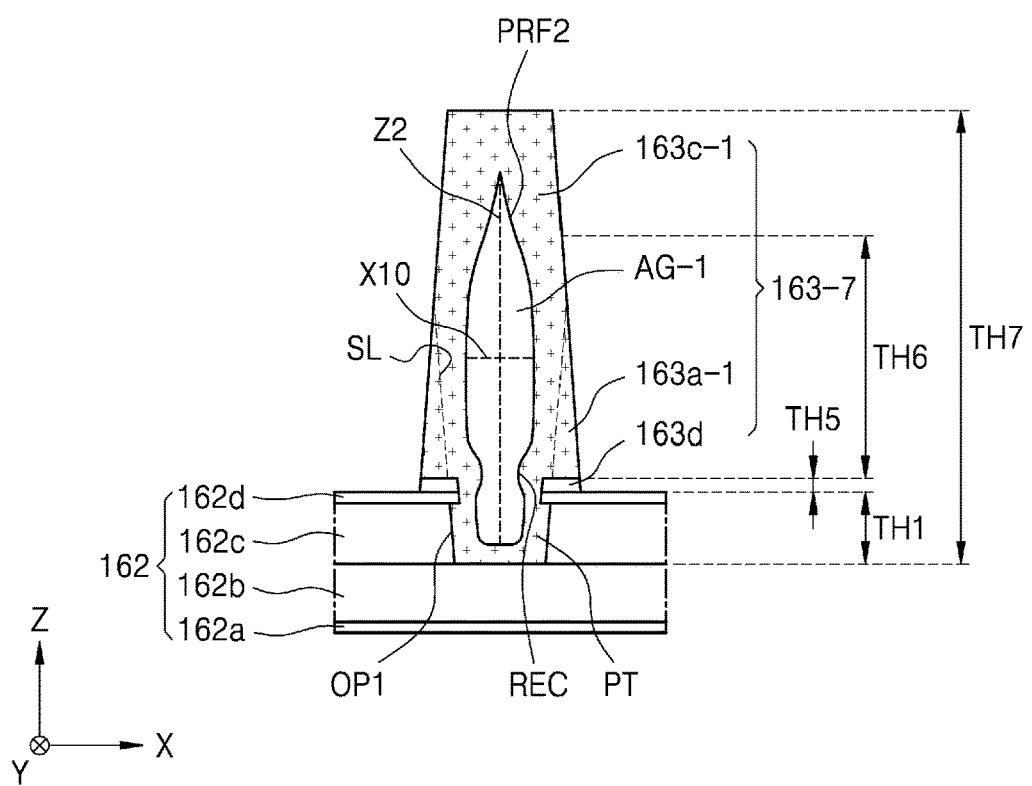
FIG. 19 is a diagram of a fence including a buried air gap of FIG. 18 in detail.

FIG. 18 is an enlarged view of a region EL of FIG. 17, and FIG. 19 is a diagram of a fence including a buried air gap of FIG. 18 in detail.

In FIGS. 18 and 19, the same or similar reference numerals as those of FIGS. 5 and 6 denote the same or similar elements. In FIGS. 18 and 19, descriptions identical or similar to those given above with reference to FIGS. 5 and 6 are briefly given or omitted.

As shown in FIG. 18, the rear side anti-reflective layer 162 may be formed on the substrate 110 and the pixel isolation structure 150. The rear side anti-reflective layer 162 may include a plurality of sub rear side anti-reflective layers 162a, 162b, 162c, and 162d. Since the sub rear side anti-reflective layers 162a, 162b, 162c, and 162d are described above with reference to FIGS. 5 and 6, detailed descriptions thereof are omitted.

The fence 163-7 may be disposed on the rear side anti-reflective layer 162 to correspond the pixel isolation structure 150 in a direction perpendicular to the substrate 110. The fence 163-7 may include a plurality of fence layers 163a-1 and 163c-1 and the barrier metal layer 163d. As needed, the fence 163-7 includes the barrier metal layer 163d. Alternatively, the fence 163-7 may include only the fence layers 163a-1 and 163c-1. The fence 163-7 may include buried air gaps AG-7 formed in the first fence layer 163a-1 and the second fence layer 163c-1. The first fence layer 163a-1 and the second fence layer 163c-1 may include a low refractive index material. Because the low-refractive-index material is described above, detailed descriptions thereof are omitted.

The fence 163-7 may include the penetration PT formed in the first opening OP1, which is connected to the second fence layer 163c-1 and penetrates through at least one of the sub rear side anti-reflective layers 162a, 162b, 162c, and 162d. Although the present embodiment illustrates that the penetration PT penetrates through the third and fourth sub rear side anti-reflective layers 162c and 162d, the penetration PT may also penetrate through all of the sub rear side anti-reflective layers 162a, 162b, 162c, and 162d.

Here, the fence 163-7 including the buried air gap AG-1 is described in more detail with reference to FIG. 19.

Referring to FIG. 19, the penetration PT includes the first opening OP1 in the rear side anti-reflective layer 162. The penetration PT may have a first thickness TH1 in the vertical direction (i.e., the Z direction) perpendicular to the surface of the rear side anti-reflective layer 162. In some embodiments, the first thickness TH1 may be about hundreds of nm.

The barrier metal layer 163d may be formed on the rear side anti-reflective layer 162 on both sides of the penetration PT. The barrier metal layer 163d may have a fifth thickness TH5 in the vertical direction (i.e., the Z direction) perpendicular to the surface of the rear side anti-reflective layer 162. In some embodiments, the fifth thickness TH5 may be a thickness of about hundred of nm smaller than the first thickness TH1.

The first fence layer 163a-1 may be formed on the barrier metal layer 163d. The first fence layer 163a-1 may have an upwardly sloped surface SL on the penetration PT. The first fence layer 163a-1 may have a sixth thickness TH6 in the vertical direction (i.e., the Z direction) perpendicular to the surface of the rear side anti-reflective layer 162. In some embodiments, the sixth thickness TH6 may be a thickness of about hundred of nm greater than the first thickness TH1 and the fifth thickness TH5.

The second fence layer 163c-1 may be formed on the first fence layer 163a-1 and in the first opening OP1. The second fence layer 163c-1 may have a seventh thickness TH7 in the vertical direction (i.e., the Z direction) perpendicular to the surface of the rear side anti-reflective layer 162. In some embodiments, the seventh thickness TH7 may be about several hundred nm.

The buried air gap AG-1 may be disposed both inside the penetration PT and inside the second fence layer 163c-1 disposed on the rear side anti-reflective layer 162. The buried air gap AG-1 may have a height Z2 in the vertical direction (i.e., the Z direction) perpendicular to the surface of the rear side anti-reflective layer 162, the height Z2 being greater than a width X10 of the buried air gap AG-1 in a horizontal direction parallel to the surface of the rear side anti-reflective layer 162. The height Z2 may be about several hundred nm, and the width X10 may be about dozens of nm.

The buried air gap AG-1 may have a candle-shaped profile PRF2 in the vertical direction (i.e., the Z direction) perpendicular to the surface of the rear side anti-reflective layer 162. The buried air gap AG-1 may include a recessed portion REC recessed in inward directions, that is, in the X direction and the −X direction near the first opening OP1.

As described later, the buried air gap AG-1 having a candle-shaped profile may be formed as the first fence layer 163a-1 and a third sub rear side anti-reflective layer 162c are etched relatively more due to differences between etching speeds of a fourth sub rear side anti-reflective layer 162d, the barrier metal layer 163d, the first fence layer 163a-1, and the third sub rear side anti-reflective layer 162c during a manufacturing process. In other words, the buried air gap AG-1 having a candle-shaped profile may be formed according to the shape of the profile of the sloped surface SL.

FIGS. 20A to 20D are cross-sectional views showing a method of manufacturing a fence constituting the image sensor of FIGS. 17 to 20.

In FIGS. 20A to 20D, the same or similar reference numerals as those of FIGS. 14A to 14D denote the same or similar elements. In FIGS. 20A to 20D, descriptions identical or similar to those given above with reference to FIGS. 14A to 14D are briefly given or omitted.

Figure 20A:
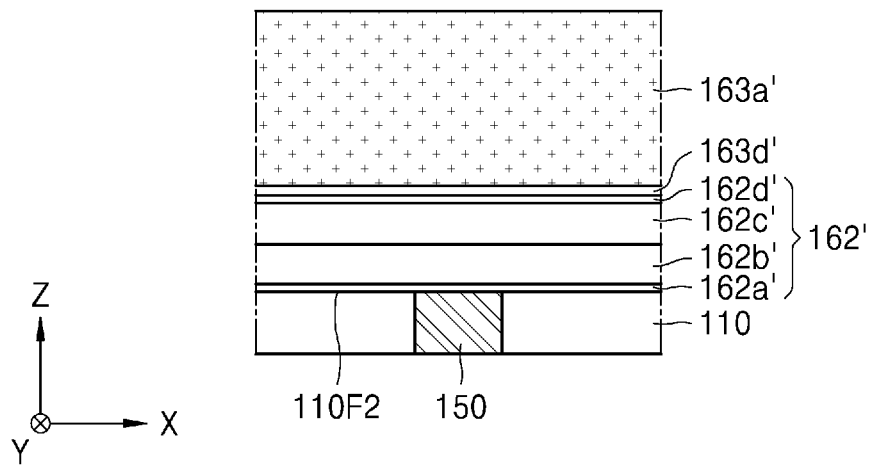
FIGS. 20A to 20D are cross-sectional views for describing a method of manufacturing an image sensor according to an embodiment.

Referring to FIG. 20A, a rear side anti-reflective material layer 162' is formed on the second surface 110F2 of the substrate 110 including the pixel isolation structure 150. The rear side anti-reflective material layer 162' may include a plurality of sub rear side anti-reflective material layers 162a', 162b', 162c', and 162d'. The sub rear side anti-reflective material layers 162a', 162b', 162c', and 162d' may include first to fourth sub rear side anti-reflective material layers 162a', 162b', 162c', and 162d'.

A barrier metal material layer 163d' and the first fence material layer 163a' are formed on the rear side anti-reflective material layer 162'. The barrier metal material layer 163d' may include a metal material layer, e.g., a TiN layer. The barrier metal material layer 163d' is formed to have a thickness less than that of the first fence material layer 163a'. The first fence material layer 163a' may be a material layer different from the barrier metal material layer 163d'. The first fence material layer 163a' may include a low refractive index material.

Figure 20B:
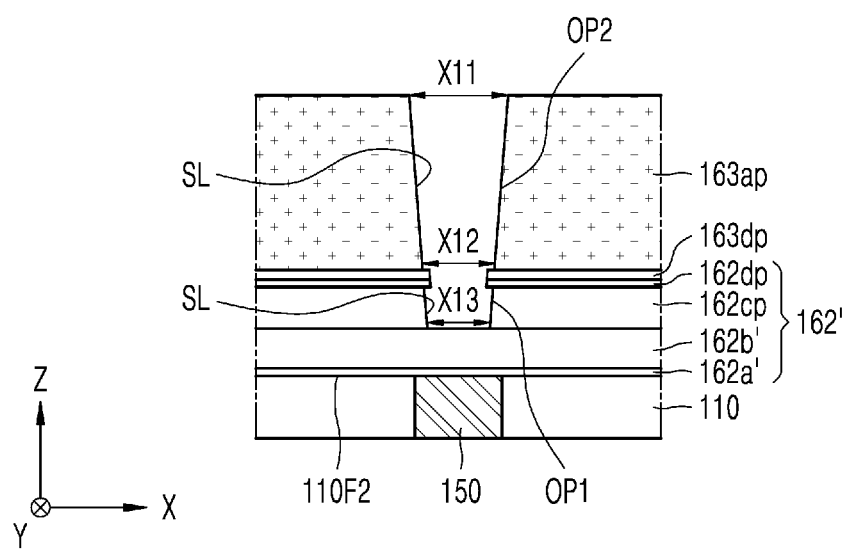

Referring to FIG. 20B, the first fence material layer 163a', the barrier metal material layer 163d', and third and fourth sub rear side anti-reflective material layers 162c' and 162d', which are portions of the rear side anti-reflective material layer 162', are patterned through a photolithography process.

Therefore, the third and fourth sub rear side anti-reflective patterns 162cp and 162dp, a barrier metal material pattern 163dp, and the first fence material pattern 163ap are formed on the second sub rear side anti-reflective material layers 162b'. Also, the first opening OP1 may be formed in the third and fourth sub rear side anti-reflective patterns 162cp and 162dp in the X direction, and the second opening OP2 may be formed in the barrier metal material patterns 163dp and the first fence material patterns 163ap in the X direction. The first opening OP1 and the second opening OP2 may communicate with each other or may be connected to each other without any specific boundary.

The upper portion of the second opening OP2 may have a width X11 on the rear side anti-reflective material layer 162'. The lower portion of the second opening OP2 may have a width X12 on the rear side anti-reflective material layer 162'. The width X12 of the lower portion of the second opening OP2 may be less than the width X11 of the upper portion of the second opening OP2.

The first opening OPt may have a width X13 on the rear side anti-reflective material layer 162'. The width X13 of the first opening OP1 may be less than the width X12 of the lower portion of the second opening OP2.

Therefore, the second opening OP2 and the first opening OP1 may each have a shape of which the width increases in the vertical direction (Z direction) perpendicular to the surface of the rear side anti-reflective layer 162. In other words, the second opening OP2 and the first opening OP1 may each have a negative-shaped sloped surface SL in the vertical direction (−Z direction) perpendicular to the surface of the rear side anti-reflective layer 162.

Furthermore, during formation of the second opening OP2 and the first opening OP1, due to differences between etching speeds of a fourth sub rear side anti-reflective material layer (162d' of FIG. 20A), a barrier metal material layer (163d' of FIG. 20A), a first fence material layer (163a' of FIG. 20A), and a third sub rear side anti-reflective material layer (162c' of FIG. 20A), the first fence material layer (163a' of FIG. 20A) and the third sub rear side anti-reflective material layer (162c' of FIG. 20A) may be etched relatively more.

Therefore, one side surfaces of a fourth sub rear side anti-reflective pattern 162dp and the barrier metal material pattern 163dp protrude in the X direction and the −X direction more than one side surfaces of the first fence material pattern 163ap and a third sub rear side anti-reflective pattern 162cp.

Figure 20C:
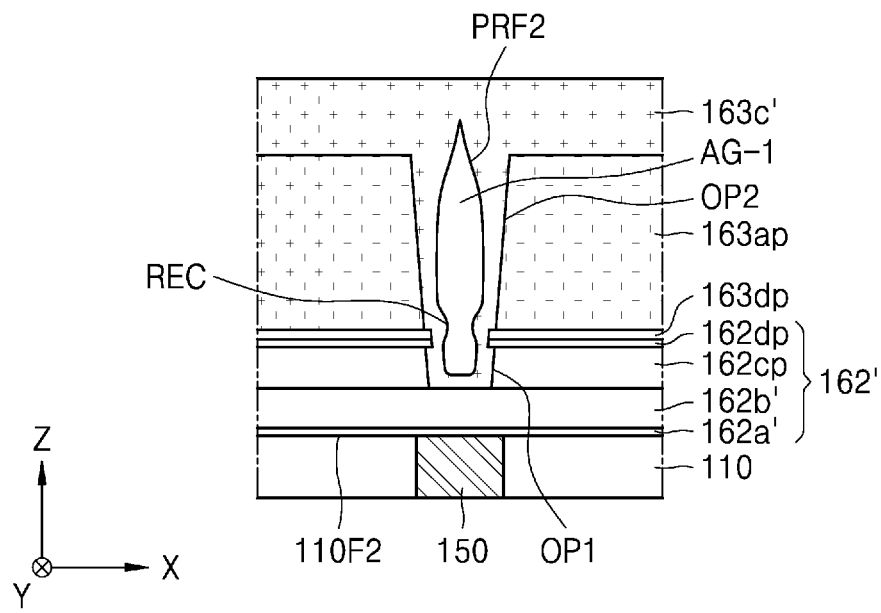

Referring to FIG. 20C, the second fence material layer 163c' filling the second opening OP2 and the first opening OP1 is formed on the first fence material pattern 163ap. The second fence material layer 163' may include a material having poor step coverage. The second fence material layer 163c' may include a low refractive index material.

When the second fence material layer 163c' has poor step coverage, the buried air gap AG-1 may be formed in the first fence material pattern 163ap. The buried air gap AG-1 may have a candle-shaped profile PRF2 in the vertical direction (Z direction) perpendicular to the surface of the rear side anti-reflective layer 162 according to the shapes of the second opening OP2 and the first opening OP1.

The buried air gap AG-1 having the candle-shaped profile PRF2 may include the recessed portion REC recessed in inward directions, that is, in the X direction and the −X direction, near the first opening OP1. Since the second fence material layer 163c' is formed while one side surfaces of the fourth sub rear side anti-reflective pattern 162dp and the barrier metal material pattern 163dp protrude in the X direction and the −X direction more than one side surfaces of the first fence material pattern 163ap and the third sub rear side anti-reflective pattern 162cp, the buried air gap AG-1 having the candle-shaped profile PRF2 may be formed.

Figure 20D:
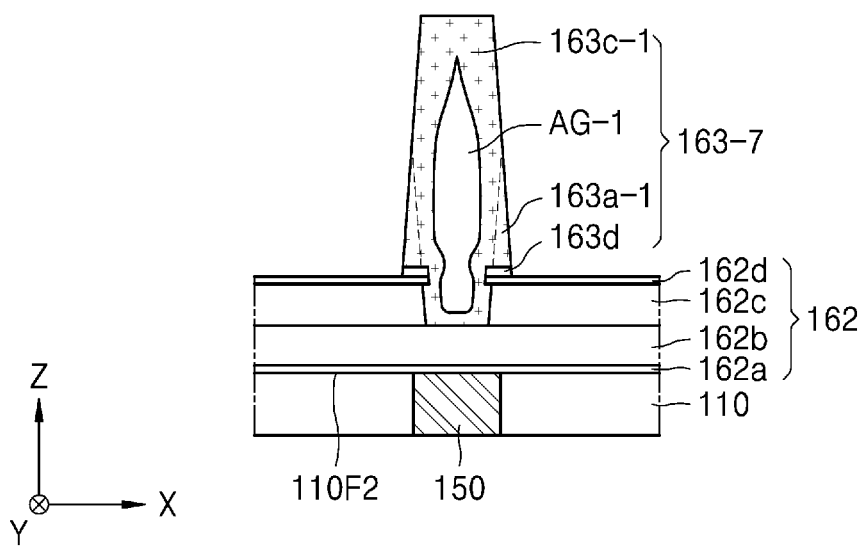

Referring to FIG. 20D, the second fence material layer 163c', the first fence material pattern 163ap, and the barrier metal material pattern 163dp are patterned through a photolithography process. Therefore, the fence 163-7 including the second fence layer 163c-1, the first fence layer 163a-1, the buried air gap AG-1, and the barrier metal layer 163d is formed.

FIGS. 21A to 21D are cross-sectional views for describing a method of manufacturing an image sensor according to an embodiment.

FIGS. 21A to 21D are provided to describe a method of manufacturing the image sensor 100 of FIGS. 3 to 6. With reference to FIGS. 21A to 21D, descriptions identical to those given above with reference to FIGS. 3 to 6 are briefly given or omitted.

Figure 21A:
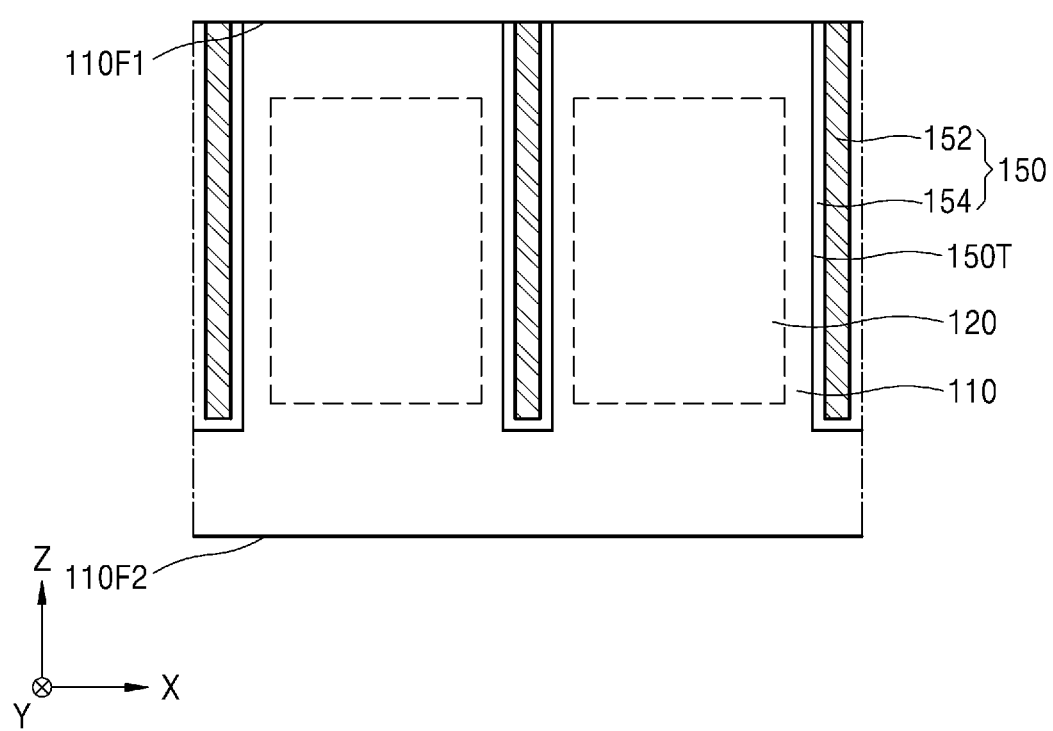
FIGS. 21A to 21D are cross-sectional views for describing a method of manufacturing an image sensor according to an embodiment.

Referring to FIG. 21A, a substrate 110 having a first surface 110F1 and a second surface 1110F2 facing each other is provided. A mask pattern (not shown) may be formed on the first surface 110F1 of the substrate 110, and a trench 150T may be formed by removing a portion of the substrate 110 from the first surface 110F1 of the substrate 110 by using the mask pattern.

Thereafter, the insulation liner 154 and the conductive layer 152 may be sequentially formed in the trench 150T, and the pixel isolation structure 150 may be formed in the trench 150T by removing portions of the insulation liner 154 and the conductive layer 152 disposed on the first surface 110F1 of the substrate 110 through a planarizing process or the like.

Thereafter, a photoelectric conversion region 120 including a photodiode region (not shown) and a well region (not shown) may be formed from the first surface 110F1 of the substrate 110 through an ion implantation process. For example, the photodiode region may be formed by implanting an N-type impurity, and the well region may be formed by implanting a P-type impurity.

Figure 21B:
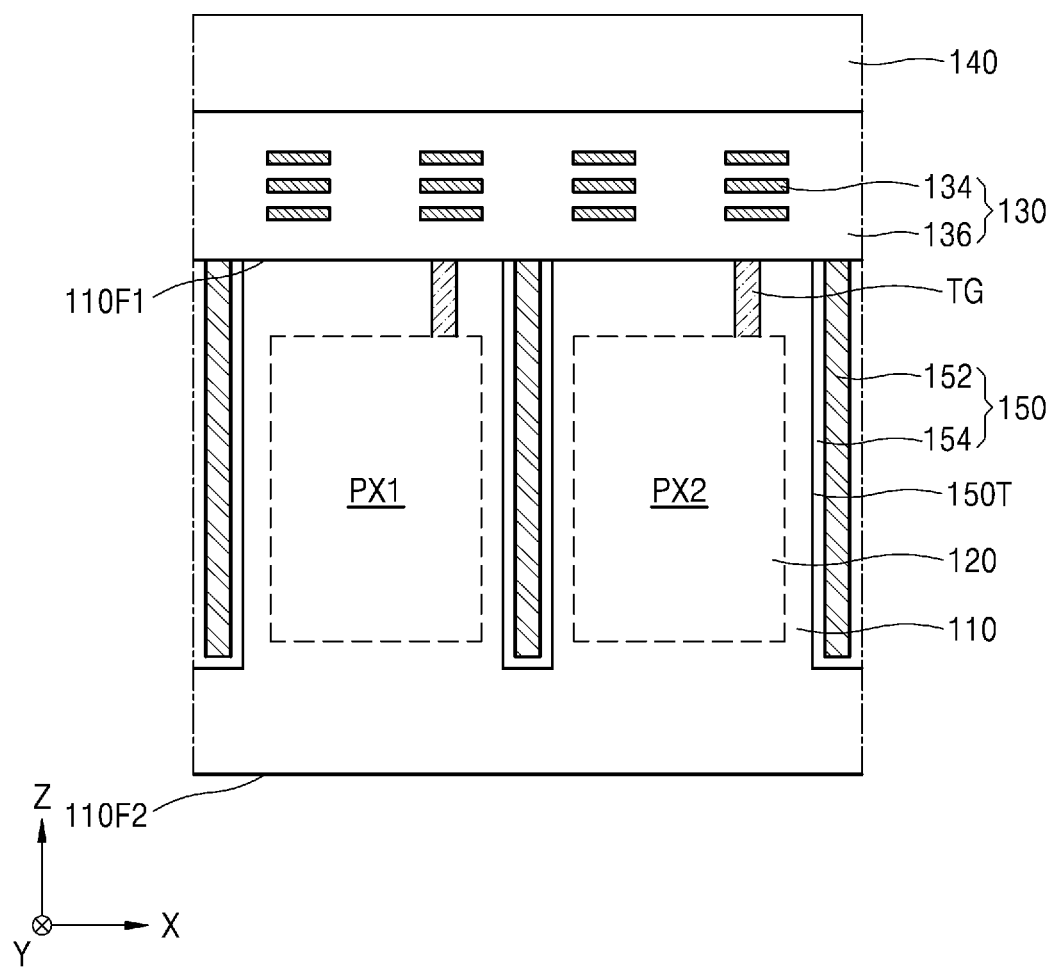

Referring to FIG. 21B, a transmission gate TG extending from the first surface 110F1 of the substrate 110 into the substrate 110 may be formed, and a floating diffusion region (not shown) and an active region (not shown) may be formed by performing an ion implantation process on regions of the first surface 110F1 of the substrate 110. As a result, pixels PX1 and PX2 may be formed.

Next, a front side structure 130 may be formed on the first surface 110F1 of the substrate 110. By repeatedly performing formation of a conductive layer (not shown) on the first surface 110F1 of the substrate 110, patterning the conductive layer, and forming an insulation layer to cover a patterned conductive layer, a wire layer 134 and an insulation layer 136 may be formed on the substrate 110. Thereafter, a supporting substrate 140 may be adhered to the insulation layer 136.

Figure 21C:
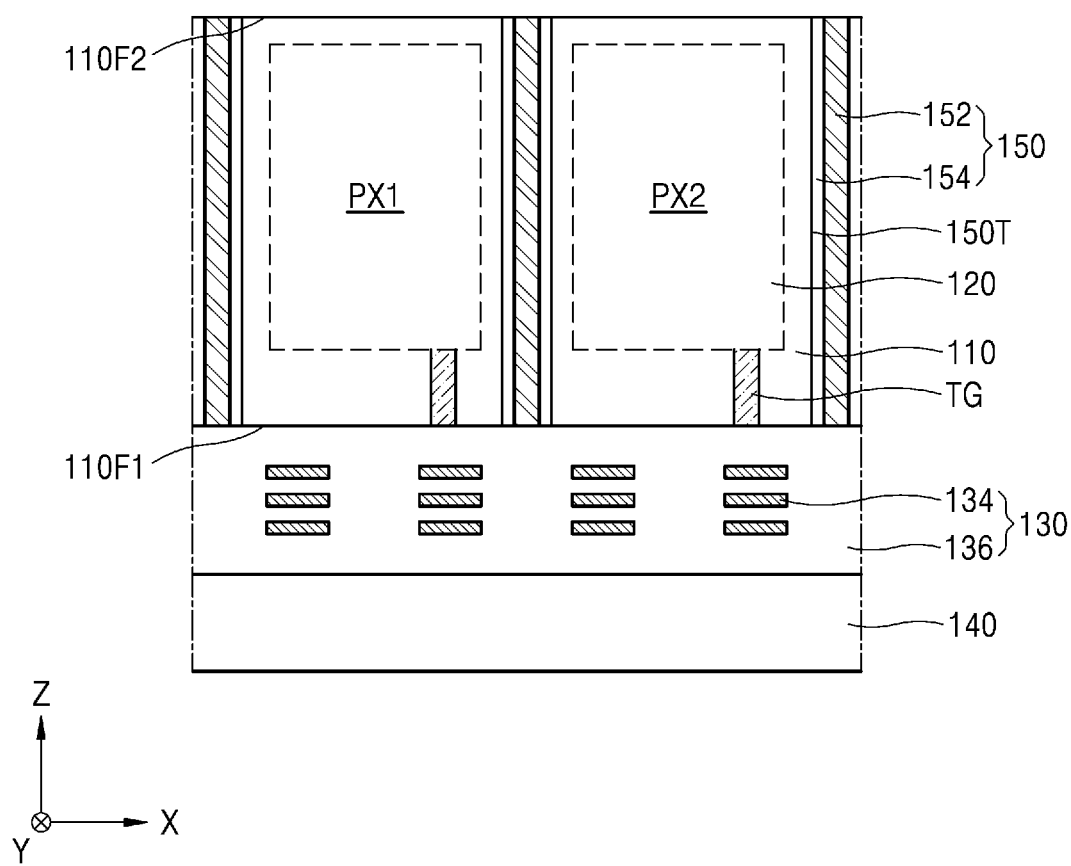

Referring to FIG. 21C, the substrate 110 may be turned upside down, such that the second surface 110F2 of the substrate 110 faces upward. Next, a portion of the substrate 110 may be removed from the second surface 110F2 of the substrate 110 by performing a planarization process like a chemical mechanical polishing (CMP) process or an etch-back process until the conductive layer 152 is exposed. As the removal process is performed, the level of the second surface 110F2 of the substrate 110 may be lowered. In this case, one pixel PX surrounded by the pixel isolation structure 150 may be physically and electrically isolated from a pixel PX adjacent thereto.

Figure 21D:
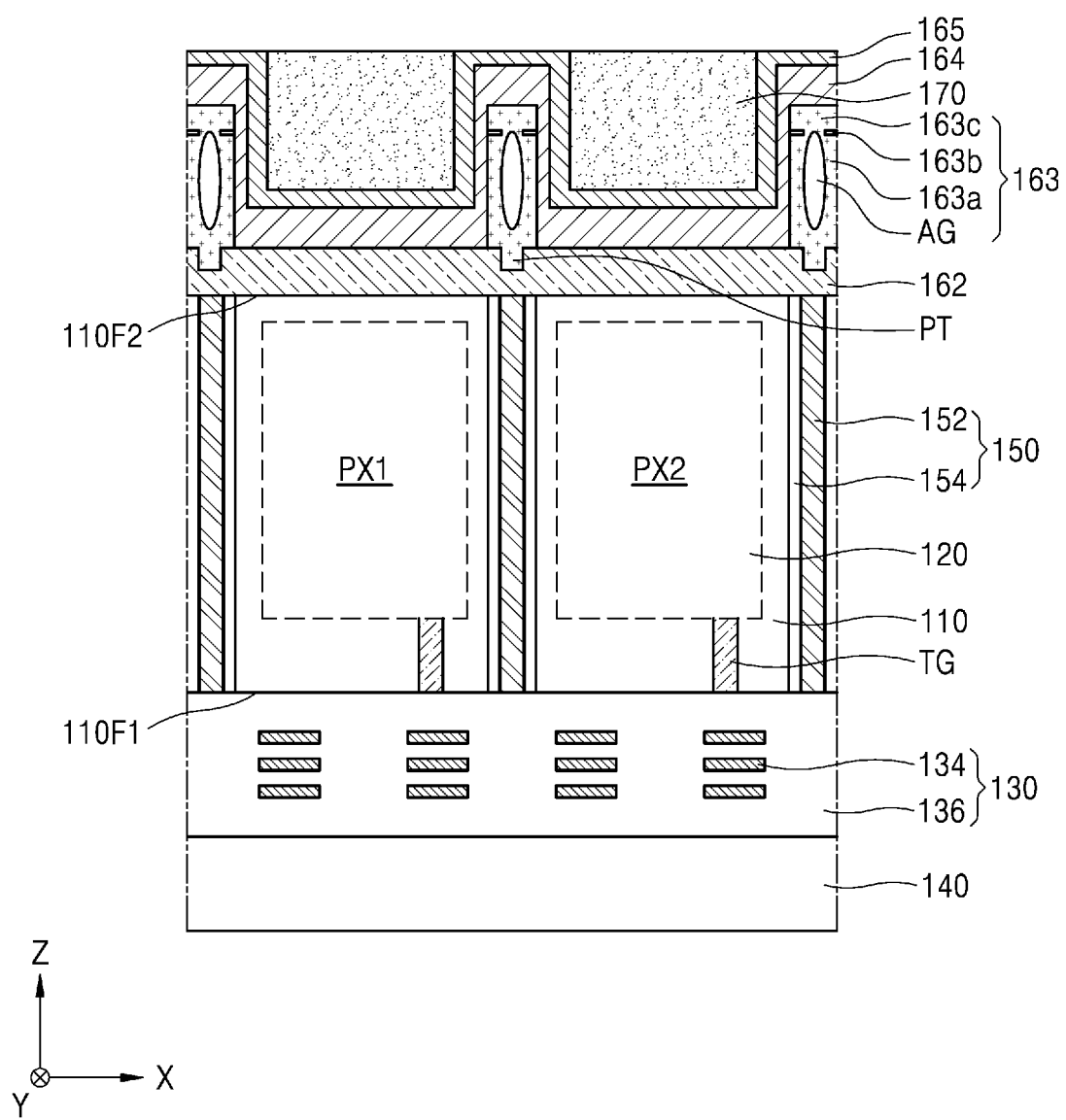

Referring to FIG. 21D, a rear surface anti-reflective layer 162 is formed on the second surface 110F2 of the substrate 110. A fence 163 may be formed on the rear side anti-reflective layer 162. As described above, the fence 163 may include a buried air gap AG, a first fence layer 163a, a fence capping layer 163b, and a second fence layer 163c.

Subsequently, an additional rear side anti-reflective layer 164 and a passivation layer 165 are formed on the fence 163 and the rear side anti-reflective layer 162. Subsequently, a color filter 170, which is separated by a fence 163-6, may be formed on the passivation layer 165. Subsequently, as shown in FIG. 4, the image sensor 100 is manufactured by forming a micro lens 180 and a capping layer 190 on the color filter 170 and the passivation layer 165.

Figure 22A:
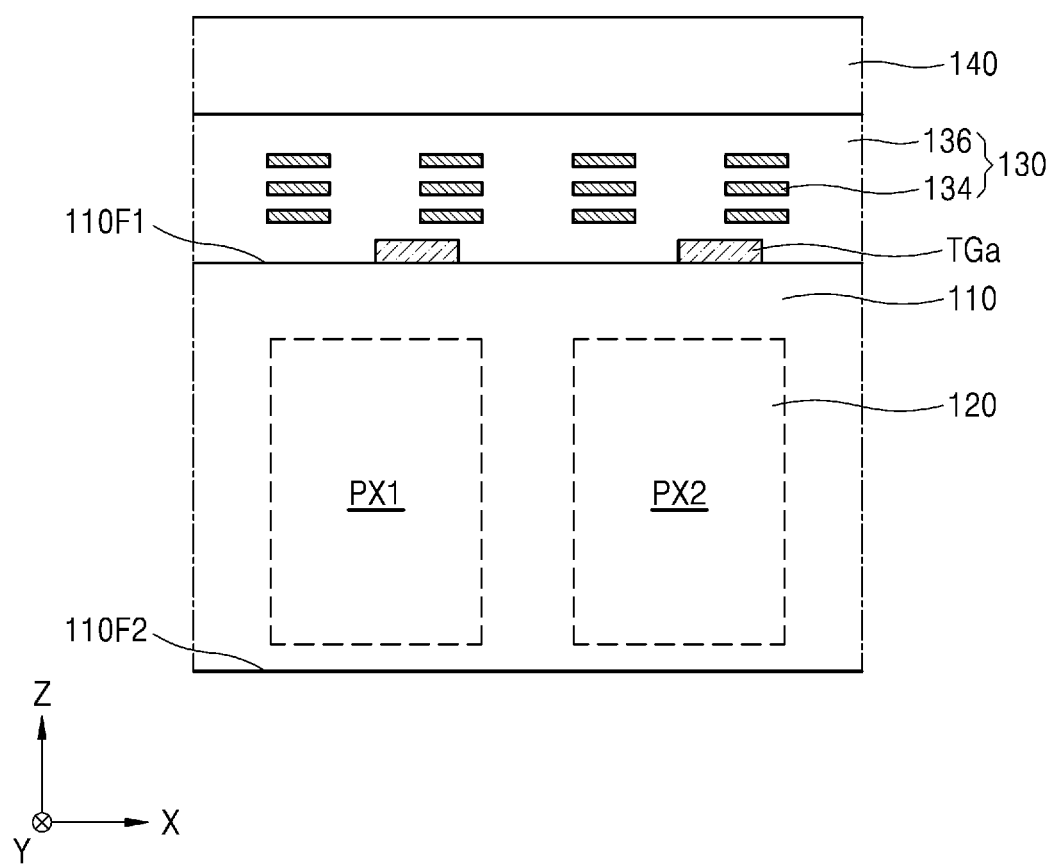
FIGS. 22A to 22C are cross-sectional views for describing a method of manufacturing an image sensor according to an embodiment.
Figure 22B:
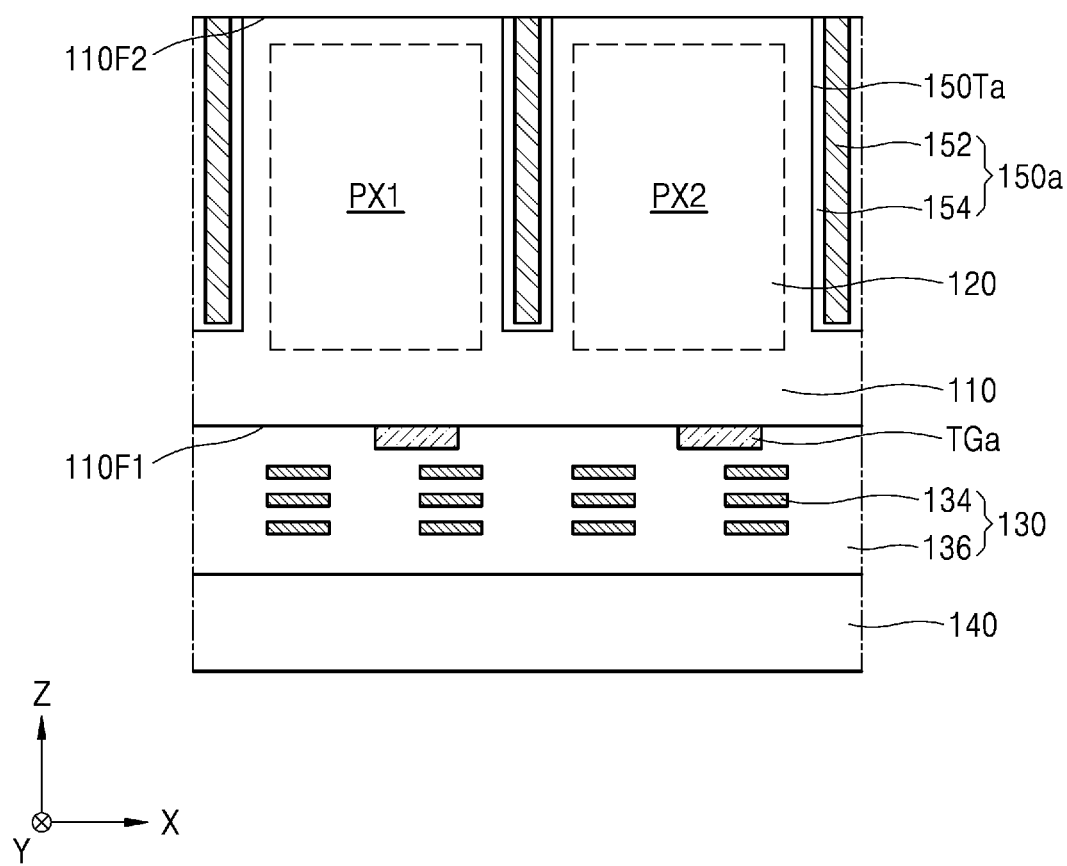
Figure 22C:
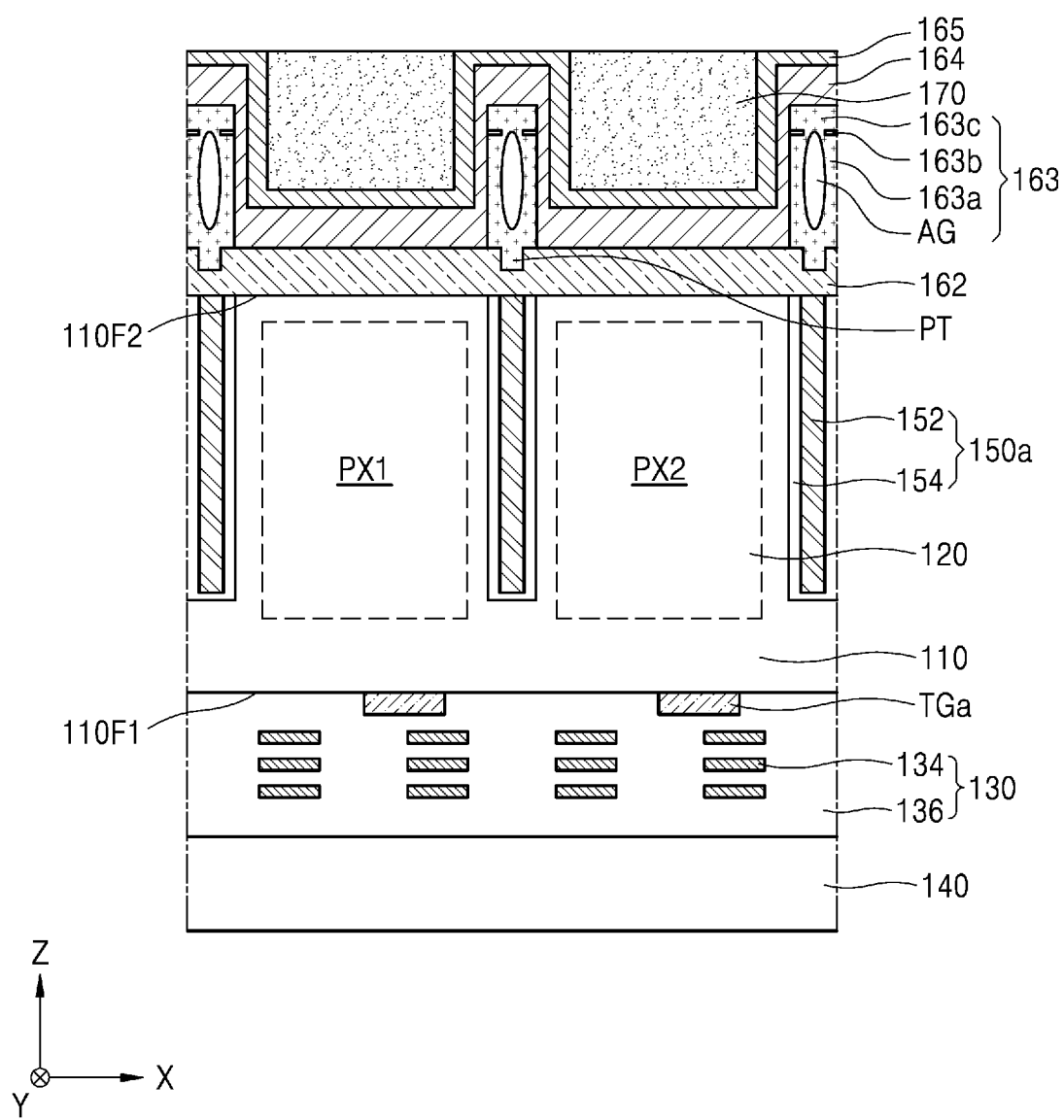

FIGS. 22A to 22C are cross-sectional views for describing a method of manufacturing an image sensor according to an embodiment of the inventive concept;

In detail, FIGS. 22A to 22C are provided to describe a method of manufacturing the image sensor 100b of FIG. 16. With reference to FIGS. 22A to 22C, descriptions identical to those given above with reference to FIGS. 3 to 6 and 16 are briefly given or omitted.

Referring to FIG. 22A, a photoelectric conversion region 120 including a photodiode region (not shown) and a well region (not shown) may be formed from the first surface 110F1 of the substrate 110 through an ion implantation process. For example, the photodiode region may be formed by implanting an N-type impurity, and the well region may be formed by implanting a P-type impurity.

A transmission gate TGa may be formed on the first surface 110F1 of the substrate 110, and a floating diffusion region (not shown) and an active region (not shown) may be formed by performing an ion implantation process on regions of the first surface 110F1 of the substrate 110. As a result, pixels PX1 and PX2 may be formed.

Next, a front side structure 130 may be formed on the first surface 110F1 of the substrate 110. By repeatedly performing formation of a conductive layer (not shown) on the first surface 110F1 of the substrate 110, patterning the conductive layer, and forming an insulation layer to cover a patterned conductive layer, a wire layer 134 and an insulation layer 136 may be formed on the substrate 110. Thereafter, a supporting substrate 140 may be adhered to the insulation layer 136.

Referring to FIG. 22B, the substrate 110 may be turned upside down, such that the second surface 110F2 of the substrate 110 faces upward. A mask pattern (not shown) may be formed on the second surface 110F2 of the substrate 110, and a trench 150Ta may be formed by removing a portion of the substrate 110 from the second surface 110F2 of the substrate 110 by using the mask pattern.

Thereafter, the insulation liner 154 and the conductive layer 152 may be sequentially formed in the trench 150Ta, and a pixel isolation structure 150a may be formed in the trench 150Ta by removing portions of the insulation liner 154 and the conductive layer 152 disposed on the second surface 110F2 of the substrate 110 through a planarizing process or the like.

Referring to FIG. 22C, a rear surface anti-reflective layer 162 is formed on the second surface 110F2 of the substrate 110. A fence 163 may be formed on the rear side anti-reflective layer 162. As described above, the fence 163 may include a buried air gap AG, a first fence layer 163a, a fence capping layer 163b, and a second fence layer 163c.

Subsequently, an additional rear side anti-reflective layer 164 and a passivation layer 165 are formed on the fence 163 and the rear side anti-reflective layer 162. Subsequently, a color filter 170, which is separated by a fence 163-6, may be formed on the passivation layer 165. Subsequently, as shown in FIG. 6, the image sensor 100b is manufactured by forming a micro lens 180 and a capping layer 190 on the color filter 170 and the passivation layer 165.

Figure 23:
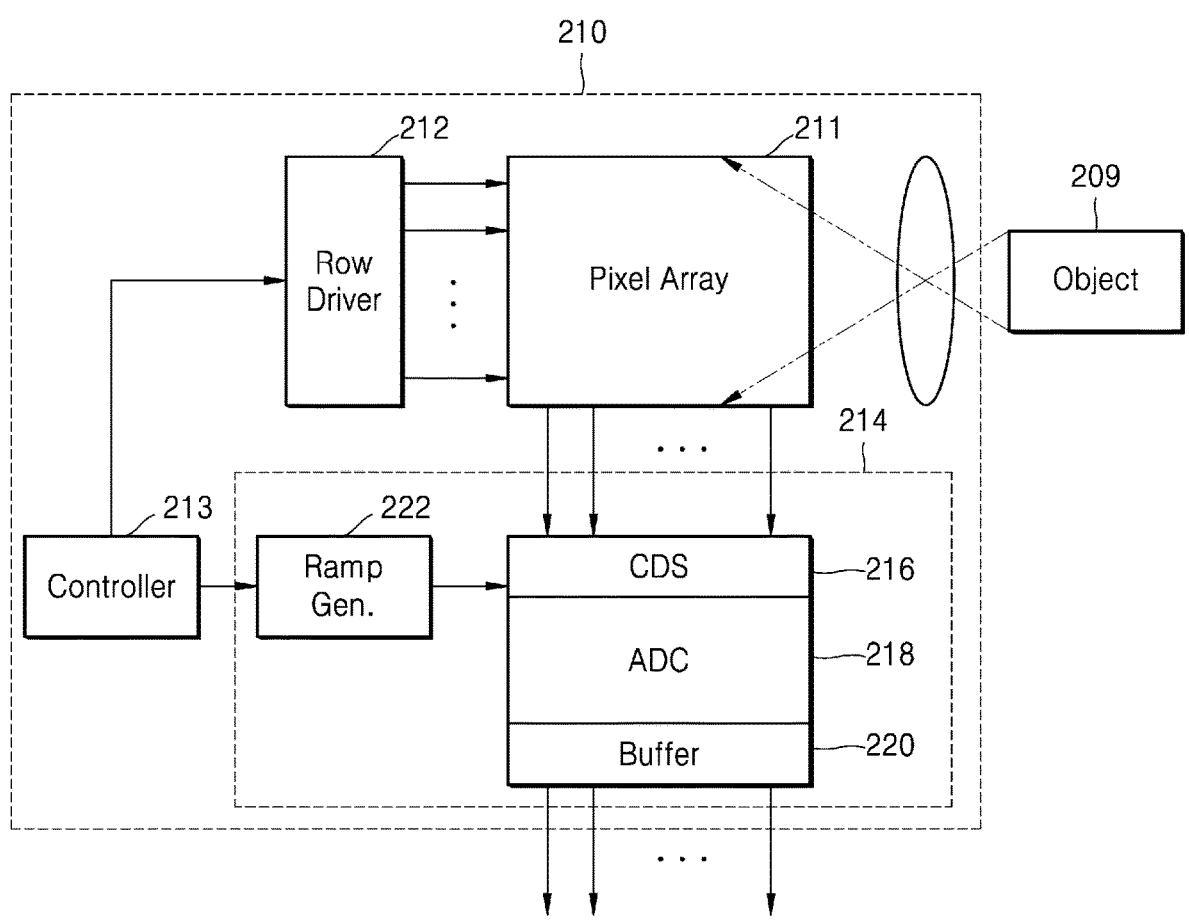
FIG. 23 is a block diagram showing a configuration of an image sensor according to an embodiment.

FIG. 23 is a block diagram showing a configuration of an image sensor according to an embodiment.

Referring to FIG. 23, an image sensor 210 may include a pixel array 211, a controller 213, a row driver 212 and a pixel signal processor 214. The image sensor 210 may include at least one of image sensors 100, 100-1 to 100-5, 100a, and 100b described above.

The pixel array 211 may include a plurality of unit pixels that are 2-dimensionally arranged, and each unit pixel may include a photoelectric conversion element. The photoelectric conversion element may absorb light to generate charges and an electric signal (output voltage) based on generated charges may be provided to the pixel signal processor 214 through a vertical signal line. Unit pixels included in the pixel array 211 may provide an output voltage row-by-row one at a time.

Accordingly, unit pixels belonging to one row of the pixel array 211 may be simultaneously activated by a selection signal output from the row driver 212. Unit pixels belonging to a selected row may provide an output voltage according to absorbed light to an output line of a corresponding column.

The controller 213 may control the row driver 212, such that the pixel array 211 absorbs light and accumulates charges or temporarily store accumulated charges and output electric signals according to stored charges to the outside of the pixel array 211. Also, the controller 213 may control the pixel signal processor 214 to measure an output voltage provided by the pixel array 211.

The pixel signal processor 214 may include a correlation double sampler (CDS) 216, an analog-digital converter (ADC) 218, and a buffer 220. The CDS 216 may sample and hold an output voltage provided by the pixel array 211. The CDS 216 may double sample a particular noise level and a level according to a generated output voltage and output a level corresponding to a difference therebetween. Also, the CDS 216 may receive ramp signals generated by a ramp signal generator 222, compare the ramp signals with output voltage provided by the pixel array 211, and output a result of the comparison. The ADC 218 may convert an analog signal corresponding to a level received from the CDS 216 into a digital signal. The buffer 220 may latch digital signals, and latched signals may be sequentially output to the outside of the image sensor 210 and transmitted to an image processor (not shown).

Figure 24:
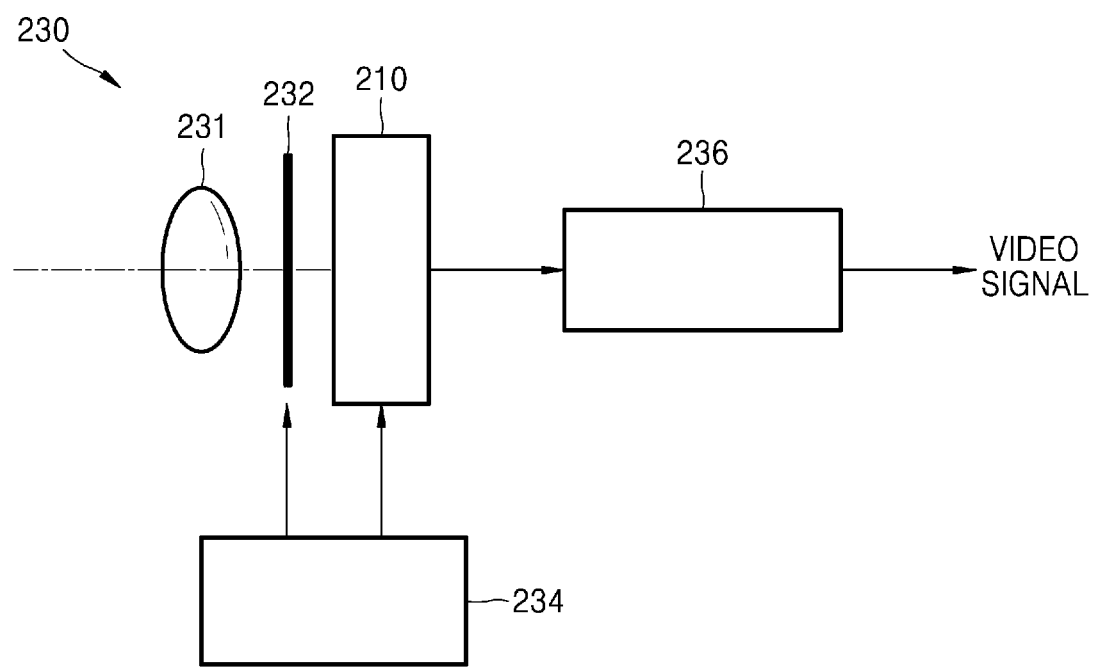
FIG. 24 is a diagram showing a configuration of a camera using an image sensor according to an embodiment.

FIG. 24 is a diagram showing a configuration of a camera using an image sensor according to an embodiment.

Referring to FIG. 24, a camera 230 includes an image sensor 210, an optics 231 that guides incident light to a light receiving sensor of the image sensor 210, a driving circuit 234 for driving a shutter device 232 and the image sensor 210, and a signal processing circuit 236 for processing output signals of the image sensor 210.

The image sensor 210 may include at least one of image sensors 100, 100-1 to 100-5, 100a, and 100b described above. The optics 231 including optical lenses concentrates image light (i.e., incident light) from an object on an imaging surface of the image sensor 210. As a result, signal charges are accumulated in the image sensor 210 for a certain period of time.

The optics 231 may be an optical lens system including a plurality of optical lenses. The shutter device 232 controls a light irradiation period and a light blocking period for the image sensor 210. The driving circuit 234 supplies a driving signal to the image sensor 210 and the shutter device 232 and controls an operation of the image sensor 210 for outputting signals to the signal processing circuit 236 and a shutter operation of the shutter device 232 based on a supplied driving signal or a timing signal.

The driving circuit 234 performs an operation of transmitting signals from the image sensor 210 to the signal processing circuit 236 by supplying a driving signal or a timing signal. The signal processing circuit 236 performs various signal processing on a signal transmitted from the image sensor 210. A video signal on which signal processing is performed is stored in a storage medium like a memory or is output to a monitor.

Figure 25:
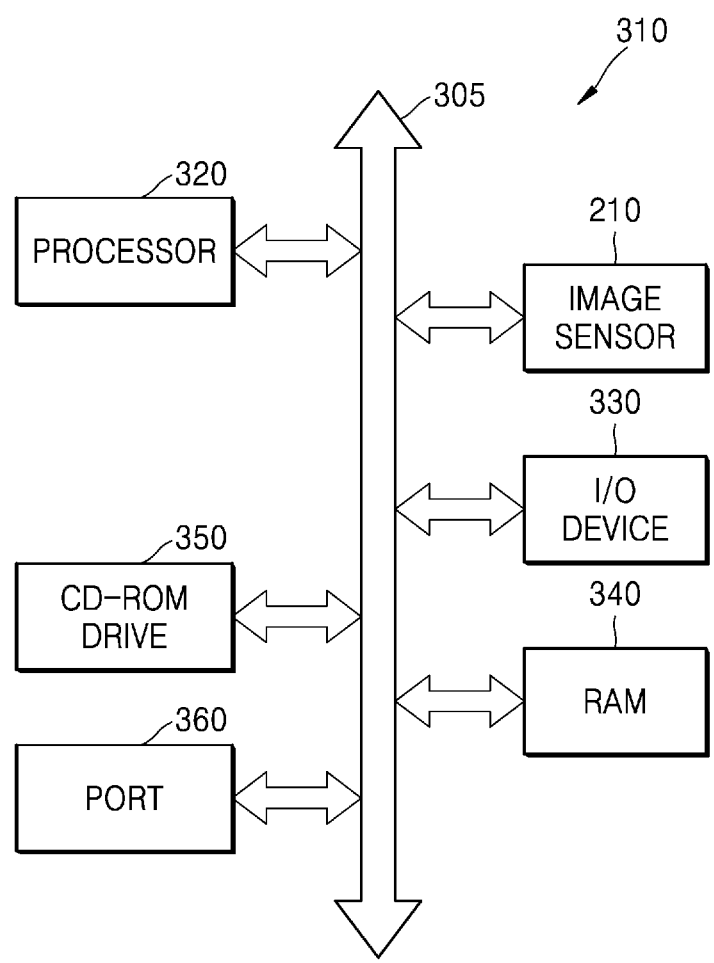
FIG. 25 is a block structure diagram of an imaging system including an image sensor according to an embodiment.

FIG. 25 is a block structure diagram of an imaging system including an image sensor according to an embodiment.

Referring to FIG. 25, an imaging system 310 is a system that processes an output image of the image sensor 210. The image sensor 210 may include at least one of image sensors 100, 100-1 to 100-5, 100a, and 100b described above. The imaging system 310 may be any type of electric and electronic system equipped with the image sensor 210, e.g., a computer system, a camera system, a scanner, and an image safety system.

A processor-based imaging system 310 like a computer system may include a processor 320 like a microprocessor or a central processing unit (CPU) capable of communicating with an input/output (I/O) device 330 through a bus 305. Through the bus 305, a compact disc read-only memory (CD-ROM) drive 350, a port 360, and a random access memory (RAM) 340 may be connected to the processor 320, exchange data, and reproduce an output image for data of the image sensor 210.

The port 360 may be a port that may be coupled to a video card, a sound card, a memory card, a USB device, etc. or is capable of communicating data with another system. The image sensor 210 may be integrated with processors like a CPU, a digital signal processor (DSP), or a microprocessor, and may also be integrated with a memory. In some cases, the image sensor 210 may be integrated as a separate chip from the processor. The imaging system 310 may be a system block diagram for a camera phone or a digital camera from among digital devices.

While some of the inventive concepts have been particularly shown and described with reference to the embodiments thereof, it will be understood that various changes in form and details may be made therein without departing from the spirit and scope of the following claims.

What is claimed is:

1. An image sensor comprising:
   a two-dimensional array of pixels extending along a first direction and a second direction perpendicular to the first direction, the two-dimensional array comprising:
   a first pixel; and
   a second pixel disposed adjacent to the first pixel, wherein the first pixel and the second pixel are arranged along the first direction;
   a pixel isolation structure disposed between the first pixel and the second pixel;
   a first anti-reflective layer disposed on the first pixel, the second pixel, and the pixel isolation structure;
   a fence disposed on the first anti-reflective layer and extending in a third direction perpendicular to the two-dimensional array, the fence comprising:
   a buried air gap;
   a first side surface extending in the third direction;
   a second side surface extending in the third direction, the second side surface being spaced apart from the first side surface along the first direction, wherein the fence is vertically aligned with the pixel isolation structure along the third direction; and
   a penetration layer penetrating through at least a portion of the first anti-reflective layer, wherein a portion of the buried air gap in the fence extends into the penetration layer;
   a second anti-reflective layer disposed on the first anti-reflective layer and the fence, wherein at least a portion of the second anti-reflective layer is disposed on at least one of the first side surface and the second side surface of the fence.

2. The image sensor of claim 1, wherein the first anti-reflective layer comprises a plurality of sub anti-reflective layers.

3. The image sensor of claim 1, wherein the fence further comprises a barrier metal layer disposed on the first anti-reflective layer, and the buried air gap and the fence are disposed between portions of the barrier metal layer.

4. The image sensor of claim 1, wherein the fence comprises a plurality of fence layers and a fence capping layer, wherein a first refractive index of the fence capping layer is higher than a second refractive index of the plurality of fence layers.

5. The image sensor of claim 1, wherein the buried air gap surrounds perimeters of the first pixel and of the second pixel.

6. The image sensor of claim 1, wherein the buried air gap partially surrounds perimeters of the first pixel and the second pixel.

7. The image sensor of claim 1, wherein the buried air gap partially overlaps first portions of perimeters of the first pixel and the second pixel that extend parallel to the second direction, and completely overlaps second portions of the perimeters of the first pixel and the second pixel that extend parallel to the first direction.

8. The image sensor of claim 1, wherein the buried air gap comprises a plurality of discrete air gap dots disposed around perimeters of the first pixel and the second pixel.

9. The image sensor of claim 1, wherein a height of the buried air gap along the third direction is greater than a width of the buried air gap along the first direction.

10. The image sensor of claim 1, wherein the buried air gap has one of a bow-shaped profile or a candle-shaped profile in a vertical plane oriented perpendicular to the two-dimensional array.

11. An image sensor comprising:
a two-dimensional array of pixels extending along a first direction and a second direction perpendicular to the first direction, the two-dimensional array comprising:
a first pixel; and
a second pixel disposed adjacent to the first pixel, wherein the first pixel and the second pixel are arranged along the first direction;
a pixel isolation structure disposed between the first pixel and the second pixel;
a first anti-reflective layer disposed on the first pixel, the second pixel, and the pixel isolation structure and comprising a plurality of sub anti-reflective layers;
a fence disposed on the first anti-reflective layer and extending in a third direction perpendicular to the two-dimensional array, the fence comprising:
a buried air gap;
a first side surface extending along the third direction;
a second side surface extending along the third direction, the second side surface being spaced apart from the first side surface along the first direction, wherein the fence is vertically aligned with the pixel isolation structure along the third direction; and
a penetration layer penetrating through at least one of the sub anti-reflective layers in the third direction, wherein the buried air gap is disposed inside the fence and extends into the penetration layer;
a second anti-reflective layer disposed on the first anti-reflective layer and the fence, wherein at least a portion of the second anti-reflective layer is disposed on at least one of the first side surface and the second side surface of the fence; and
a passivation layer disposed on the second anti-reflective layer.

12. The image sensor of claim 11, wherein:
the fence further comprises a barrier metal layer disposed on the first anti-reflective layer; and
the penetration layer of the fence is disposed between portions of the barrier metal layer.

13. The image sensor of claim 11, wherein the fence further comprises:
a first fence layer formed on the first anti-reflective layer;
a fence capping layer formed on the first fence layer; and
a second fence layer formed on the fence capping layer, wherein the penetration layer is connected to the first fence layer and the buried air gap is disposed in the first fence layer.

14. The image sensor of claim 11, wherein the fence further comprises:
a first fence layer formed on the first anti-reflective layer and being disposed at an inclination relative to the first anti-reflective layer; and
a second fence layer formed on the first fence layer wherein the buried air gap is disposed in the second fence layer.

15. An image sensor comprising:
a substrate having a first surface and a second surface opposite to the first surface;
a two-dimensional array of pixels disposed in the substrate, the two-dimensional array extending along a first direction and a second direction perpendicular to the first direction, the two-dimensional array comprising:
a first pixel disposed in the substrate; and
a second pixel disposed in the substrate and adjacent to the first pixel, wherein the first pixel, the second pixel, and the gap between the first pixel and the second pixel are arranged along the first direction;
a pixel isolation structure disposed between the second surface and the first surface of the substrate and between the first pixel and the second pixel;
a first anti-reflective layer disposed on the first pixel, the second pixel, and the pixel isolation structure and comprising a plurality of sub anti-reflective layers;
a fence disposed on the first anti-reflective layer and extending in a third direction perpendicular to the two-dimensional array, the fence comprising:
a buried air gap;
a first side surface extending in the third direction;
a second side surface extending in the third direction, the second side surface being spaced apart from the first side surface along the first direction, wherein the fence is vertically aligned with the pixel isolation structure along the third direction; and
a penetration layer penetrating through at least one of the sub anti-reflective layers in the third direction, wherein the buried air gap is disposed inside the fence and extends into he penetration layer;
a second anti-reflective layer disposed on the first anti-reflective layer and the fence, wherein at least a portion of the second anti-reflective layer is disposed on at least one of the first side surface and the second side surface of the fence;
a passivation layer disposed on the second anti-reflective layer; and
a plurality of color filters, including a first color filter vertically aligned in the third direction with the first pixel, and a second color filter vertically aligned in the third direction with the second pixel, wherein the fence separates the first color filter from the second color filter.

16. The image sensor of claim 15, wherein the pixel isolation structure comprises a filled trench disposed between the first surface and the second surface of the substrate.

17. The image sensor of claim 1, wherein a passivation layer is disposed on the second anti-reflective layer.

* * * * *